(12) United States Patent
Saeki et al.

(10) Patent No.: US 6,802,934 B2
(45) Date of Patent: Oct. 12, 2004

(54) PROCESSING APPARATUS

(75) Inventors: Hiroaki Saeki, Shirane-Machi (JP); Keiichi Matsushima, Kofu (JP); Teruo Asakawa, Yamanashi-Ken (JP); Masaki Narushima, Sakaigawa-Mura (JP)

(73) Assignee: Tokyo Electron Limited, Tokyo-to (JP)

( * ) Notice: Subject to any disclaimer, the term of this patent is extended or adjusted under 35 U.S.C. 154(b) by 0 days.

(21) Appl. No.: 10/378,890

(22) Filed: Mar. 5, 2003

(65) Prior Publication Data
US 2003/0136515 A1 Jul. 24, 2003

Related U.S. Application Data

(63) Continuation of application No. 09/851,330, filed on May 9, 2001, now abandoned, which is a continuation-in-part of application No. PCT/JP99/06266, filed on Nov. 9, 1999.

(30) Foreign Application Priority Data

Nov. 9, 1998 (JP) ........................................... 10-334974

(51) Int. Cl.[7] ........................ H01L 21/00; C23C 16/00
(52) U.S. Cl. ........................ 156/345.31; 156/345.32; 414/935; 414/936; 414/217; 118/719
(58) Field of Search ................ 156/345.31, 345.32; 414/935–941, 217, 805; 118/719

(56) References Cited

U.S. PATENT DOCUMENTS

| 5,180,276 A | | 1/1993 | Hendrickson |
| 5,186,718 A | | 2/1993 | Tepman et al. |
| 5,474,410 A | * | 12/1995 | Ozawa et al. ............... 414/217 |
| 5,556,248 A | | 9/1996 | Grunes |
| 5,740,034 A | | 4/1998 | Saeki |
| 5,765,444 A | | 6/1998 | Bacchi et al. |
| 5,772,386 A | | 6/1998 | Mages et al. |
| 5,789,878 A | | 8/1998 | Kroeker et al. |
| 6,057,662 A | * | 5/2000 | McAndrew et al. ........ 318/567 |
| 6,257,827 B1 | * | 7/2001 | Hendrickson et al. ...... 414/805 |

FOREIGN PATENT DOCUMENTS

| JP | 6-268041 | 9/1994 |
| JP | 6-314730 | 11/1994 |
| JP | 6-314731 | 11/1994 |
| JP | 7-321178 | 12/1995 |
| JP | 8-279546 | 10/1996 |
| JP | 10-135301 | 5/1998 |
| JP | 10-189680 | 7/1998 |
| WO | WO 00/28587 | 5/2000 |

OTHER PUBLICATIONS

Form PCT/IB/301 (Notification of Receipt of Record Copy) (PCT/JP99/06226).
International Search Report for PCT/JP99/06226.

(List continued on next page.)

Primary Examiner—Gregory Mills
Assistant Examiner—Ram N Kackar
(74) Attorney, Agent, or Firm—Smith, Gambrell & Russell

(57) ABSTRACT

Two load lock chambers 130 and 132 are arranged between a first transfer chamber 122 and a second transfer chamber 133. Each of the load lock chambers is capable of accommodating a single wafer W. The first transfer chamber 122 is provided with a first transfer unit 124 having two substrate holders 124*a*, 124*b* each capable of holding a single object to be processed, in order to transport the wafer W among a load port site 120, the first load lock chamber 130, the second load lock chamber 132 and a positioning unit 150. The second transfer chamber 133 is provided with a second transfer unit 156 having two substrate holders 156*a*, 156*b* each capable of holding the single object to be processed, in order to transport the wafer between the first load lock chamber 130, the second load lock chamber 132 and respective vacuum processing chambers 158 to 164. Since the volume of each load lock chamber can be minimized, it is possible to perform the prompt control of atmospheres in the load lock chambers. Additionally, it is possible to perform the delivery of the wafers promptly.

10 Claims, 17 Drawing Sheets

OTHER PUBLICATIONS

Form PCT/IB/308 (Notice Informing The Applicant of the Communication of the International Application to the Designated Offices) (PCT/JP99/06226).
PCT Request (PCT/JP99/06226) (in Japanese).
Notification Concerning Submission or Transmittal of Priority Document (PCT/IB/304).
Form PCT/IPEA/409 International Preliminary Examination Report for PCT/JP99/06226 (in Japanese).

Form PCT/IPEA/401 for PCT/JP99/06226 (in Japanese).

PCT Notification of Transmittal of Copies of Translation of the International Preliminary Examination Report (PCT/IB/338) dated Mar. 30, 2001 in English.

English Translation of Preliminary Examination Report (PCT/IPEA/409) dated Mar. 30, 2001.

* cited by examiner

PROCESSING APPARATUS

The present application is a continuation of Ser. No. 09/851,330, filed May 9, 2001 now abandoned, which is a continuation-in-part of Application No. PCT/JP99/06266, filed Nov. 9, 1996, each of which is incorporated herein in its entirety by reference.

TECHNICAL FIELD OF THE INVENTION

The present invention relates to a multi-chamber type processing apparatus for processing an object to be processed, such as semiconductor wafer.

BACKGROUND OF THE INVENTION

The manufacturing process for semiconductor devices conventionally employs the so-called "clustered" multi-chamber type processing apparatus that comprises, in view of improvement in its throughput and prevention of contamination of semiconductor devices, a vacuum transfer chamber (transfer chamber) at the center of the apparatus, a plurality of vacuum processing chambers (process chambers) around the transfer chamber, one or more load lock chambers and a vacuum preparation chamber for heating or cooling the objects to be processed. The apparatus further includes a plurality of load ports each capable of mounting a cassette thereon. The load ports are connected to the load lock chambers through a transfer chamber on the side of the atmosphere, constituting a load port site. In the multi-chamber type processing apparatus, there are included: a processing apparatus that has a "batch" type load lock chamber for accommodating the cassette itself or a plurality of objects, for example, semiconductor wafers (simply referred "wafers" after) in the cassette; and another processing apparatus provided with a single-wafer load lock chamber for accommodating a single wafer therein. The former apparatus will be called "batch type processing apparatus" hereinafter. Similarly, the latter apparatus will be called "single wafer processing apparatus" hereinafter.

The processing order in the batch type processing apparatus will be described. After first mounting a sealed (closing) type cassette on the load port, a first transfer arm in the atmospheric transfer chamber conveys the cassette itself or all wafers in the cassette, for example, thirteen or twenty-five pieces of wafers, into the load lock chamber. Next, the load lock chamber is closed up and evacuated into vacuum. After the general equalization of pressure is established between the load lock chamber and the vacuum transfer chamber, these chambers are communicated with each other. Subsequently, each wafer in the load lock chamber is adjusted in position by an object positioning unit arranged in the vacuum transfer chamber or the vicinity and thereafter, a second transfer arm in the vacuum transfer chamber transports the aligned (positioned) wafer to a vacuum preliminary chamber or each vacuum processing chamber to apply a designated processing, such as thin film deposition, on the wafer. The processed wafer is again transferred to the load lock chamber or the cassette therein by the second transfer arm. Upon collecting all the wafers, the load lock chamber is sealed up again to raise the pressure of the atmosphere in the chamber. Next, the load lock chamber is communicated with the transfer chamber on the side of the atmosphere. Thereafter, the first transfer arm either conveys the cassette to the load port or transports the wafer to the cassette on the load port.

While, the processing order of the single wafer processing apparatus is as follows. After the wafers in the cassette mounted on the load port have been adjusted in position by the object positioning unit in the vicinity of the transfer chamber on the side of the atmosphere, the first transfer arm transfers the wafers into the load lock chamber one by one. Next, the load lock chamber is sealed up and evacuated for vacuum. As similar to above, after the pressure of the atmosphere in the load lock chamber becomes equal to the pressure of the atmosphere in the vacuum transfer chamber substantially, the interior of the load lock chamber is communicated with the vacuum transfer chamber. Thereafter, the second transfer arm transports the wafer in the load lock chamber to the vacuum preliminary chamber or each vacuum processing chamber to apply a designated processing similar to the above on the wafer. The processed wafer is again transferred to the load lock chamber by the second transfer arm. After the load lock chamber is sealed up again to raise the pressure of the atmosphere in the chamber, the load lock chamber is communicated with the transfer chamber on the side of the atmosphere. Thereafter, the first transfer arm transports the wafer to the cassette on the load port. Note, the above-mentioned steps are successively carried out every cassette.

In order to reduce the possibility that particles invade the interior of the transfer chamber on the side of the atmosphere, the batch type processing apparatus and the single wafer processing apparatus commonly supply the transfer chamber on the side of the atmosphere with a clean gas, such as $N_2$, to make the pressure of the transfer chamber relatively higher than the pressure of a clean room having the transfer chamber on the side of the atmosphere, the load port site, etc. arranged therein.

In the above-mentioned batch type processing apparatus, however, it takes a lot of time to exhaust the atmosphere in the load lock chamber or supply the same chamber with gas since the load lock chamber is formed with a volume capable of accommodating a cassette itself or several wafers. Additionally, since the batch type processing apparatus has to arrange the object positioning unit adjacent to the vacuum transfer chamber, the number of wafer delivery times by the second transfer arm is increased to make the transfer time (cycle) long. Consequently, the problems may cause the throughput of the apparatus to be lowered.

In the above-mentioned single wafer processing apparatus, when the first transfer arm or the second transfer arm is constructed to carry the only wafer, it takes a lot of time to deliver the wafer through the load lock chamber. If a plurality of mount tables for mounting the wafer thereon is provided in the load lock chamber, then it is possible to reduce the above wafer delivery time. However, as similar to the batch type processing apparatus, it takes a lot of time to exhaust the atmosphere in the load lock chamber or supply the same chamber with gas because the volume of the load lock chamber is increased. Consequently, the problem may cause the throughput of the apparatus to be lowered.

SUMMARY OF THE INVENTION

Under such a situation, the present invention is provided in consideration of the above-mentioned problems in the conventional art. The object of the invention is to provide a new and improved multi-chamber type processing apparatus which is capable of substantially shortening a time until an object in the cassette has been loaded into the vacuum processing chamber, a transportation cycle of the object in the second transfer chamber and a time until the processed object has been loaded into the caste, thereby to improve the throughput of the apparatus.

In order to accomplish the above object, the present invention provides a processing apparatus, which includes: a first enclosure defining a first transfer space having an atmosphere of atmospheric pressure; a load port site, in which a plurality of load ports are aligned adjacently to the first transfer space, each of the load ports being capable of mounting a cassette for accommodating objects to be processed, the cassette having a door; a plurality of door openers provided at the load ports respectively to open and close the door of the cassette, the door openers each allowing the first transfer space to communicate with an interior of the cassette when the door opener opens the door of the cassette; a second enclosure defining a second transfer space having an atmosphere of vacuum or negative pressure; a plurality of vacuum processing chambers arranged around the second transfer space; a plurality of load lock chambers opposed to the load port site over the first transfer space and also disposed between the first transfer space and the second transfer space, the load lock chambers each capable of accommodating only one object therein; first gate valves arranged at the load lock chambers, respectively, to separate the load lock chamber from the first transfer space; second gate valves arranged at the load lock chambers, respectively, to separate the load lock chamber from the second transfer space; third gate valves arranged at the vacuum processing chambers, respectively, to separate the vacuum processing chamber from the second transfer space; a positioning unit that adjusts the positions of an object and is arranged adjacent to the first transfer space; a first transfer unit arranged in the first transfer space to transfer an object among the cassette, the load lock chambers and the positioning unit, the first transfer unit having two holders each capable of holding only one object; and a second transfer unit arranged in the second transfer space to transfer the objects between the load lock chambers and the vacuum processing chambers, the second transfer unit having two holders each capable of holding only one object.

With the constitution mentioned above, owing to the adoption of the single substrate processing apparatus capable of accommodating the only one object in each load lock chamber, it is possible to reduce the volume of each load lock chamber in comparison with that of a "batch" type load lock chamber, whereby both evacuation (vacuum formation) time and gas-supply time of the load lock chambers can be shortened substantially. Additionally, with the adoption of the above load lock chambers, it is possible to reduce the number of delivering the object by the second transfer unit arranged in the second transfer space having a pressure reduced atmosphere since the positioning unit is arranged adjacent to the first transfer unit. Each of the first and second transfer units is capable of carrying two objects to be processed and also transporting each object in a predetermined direction. Therefore, even when adopting the load lock chambers each capable of accommodating the single object, it is possible to accomplish prompt delivery/replacement of the object between the first transfer space and each load lock chamber and also between the load lock chamber and the second transfer space. Consequently, with the shortening of respective transportation time and gas-supply/exhaust time, the throughput of the apparatus can be improved. Furthermore, since the load lock chambers are arranged to oppose the load port site over the first transfer space, the transportation distance for the objects can be reduced to shorten the transportation time.

In the present invention, preferably, the first transfer unit is movable in a direction parallel with an arrangement direction of the load ports and the positioning unit is adjacent to an end of the first transfer space with respect to the arrangement direction of the load ports. If a linear motor drives to move the first transfer unit in parallel with the arrangement of the load ports, then it is possible to transfer the object promptly. Further, owing to the above arrangement of the positioning unit adjacent to the end of the first transfer space in the arrangement direction of the load ports, there is no limitation to arrange the respective load ports and the respective load lock chambers.

Further, the positioning unit may be arranged between two of the load lock chambers. Then, since it is possible to reduce the transportation distances of the object between the respective load ports and the positioning unit and also between the positioning unit and the respective load lock chambers relatively, the transportation period of the object can be shortened to improve the throughput of the apparatus furthermore.

Further, if the load lock chamber is provided with a cooling unit for cooling the objects or a heating unit for heating the objects, then there in no need to provide a cooling chamber or a heating chamber in the neighborhood of the second transfer space. As a result, since the steps of transporting the object to the cooling chamber or the heating chamber can be eliminated, it is possible to reduce the number of transporting the object by the second transfer unit, improving the throughput of the apparatus furthermore.

Further, if circulating the clean gas in the first transfer space, it is possible to prevent particles from invading the first transfer space, the load lock chambers and the opened cassette and also possible to prevent the particles from adhering to the objects, thereby improving the yield of products.

BRIEF DESCRIPTION OF THE DRAWINGS

FIG. 13A shows a condition to put on and take off the cassette and FIG. 13B shows a condition to fix the cassette;

DESCRIPTION OF THE PREFERRED EMBODIMENTS

With reference to the attached drawings, we now describe one embodiment where the multi-chamber type processing apparatus of the present invention is applied to a multi-chamber type processing apparatus for forming various designated films on wafers, in detail.

(1) General Structure of Processing Apparatus

First, referring to FIGS. 1 to 7, the whole structure of the multi-chamber type processing apparatus 100 of the invention will be described.

Figure 1:
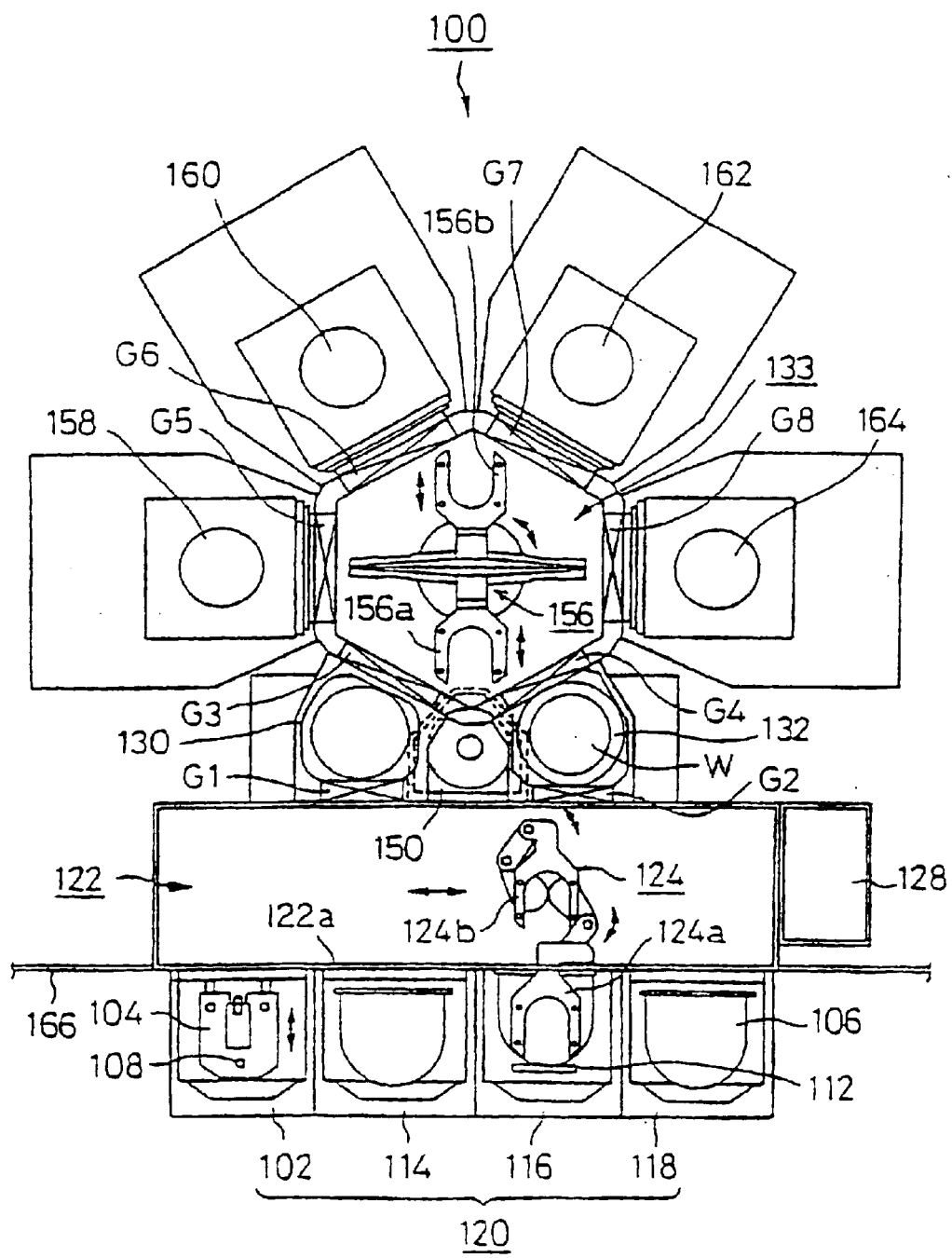
FIG. 1 is a schematic explanatory view showing a multi-chamber type processing apparatus to which the present invention is applicable.
Figure 2:
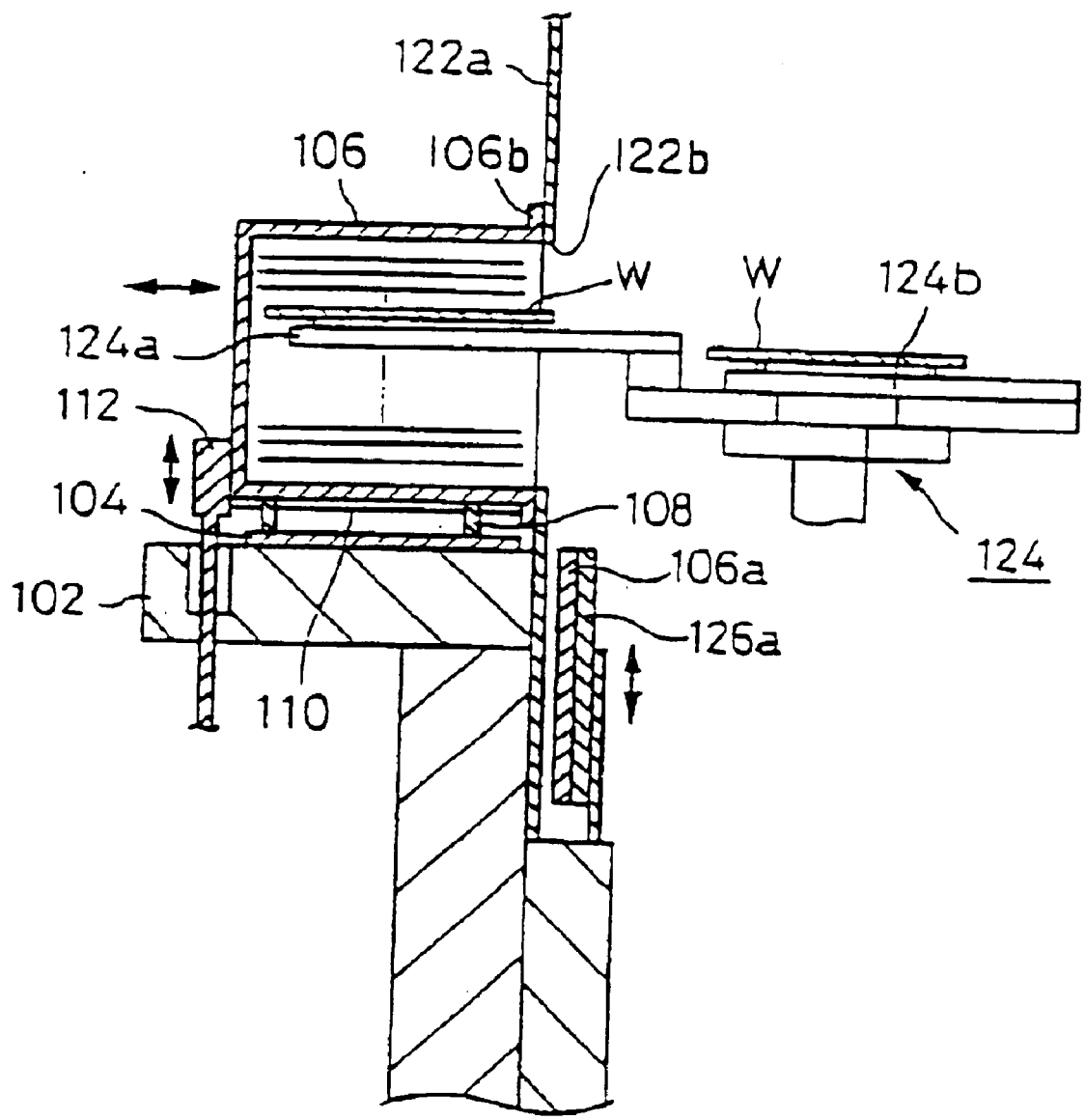
FIG. 2 is a schematic sectional view showing a load port and a cassette of FIG. 1.
Figure 4:
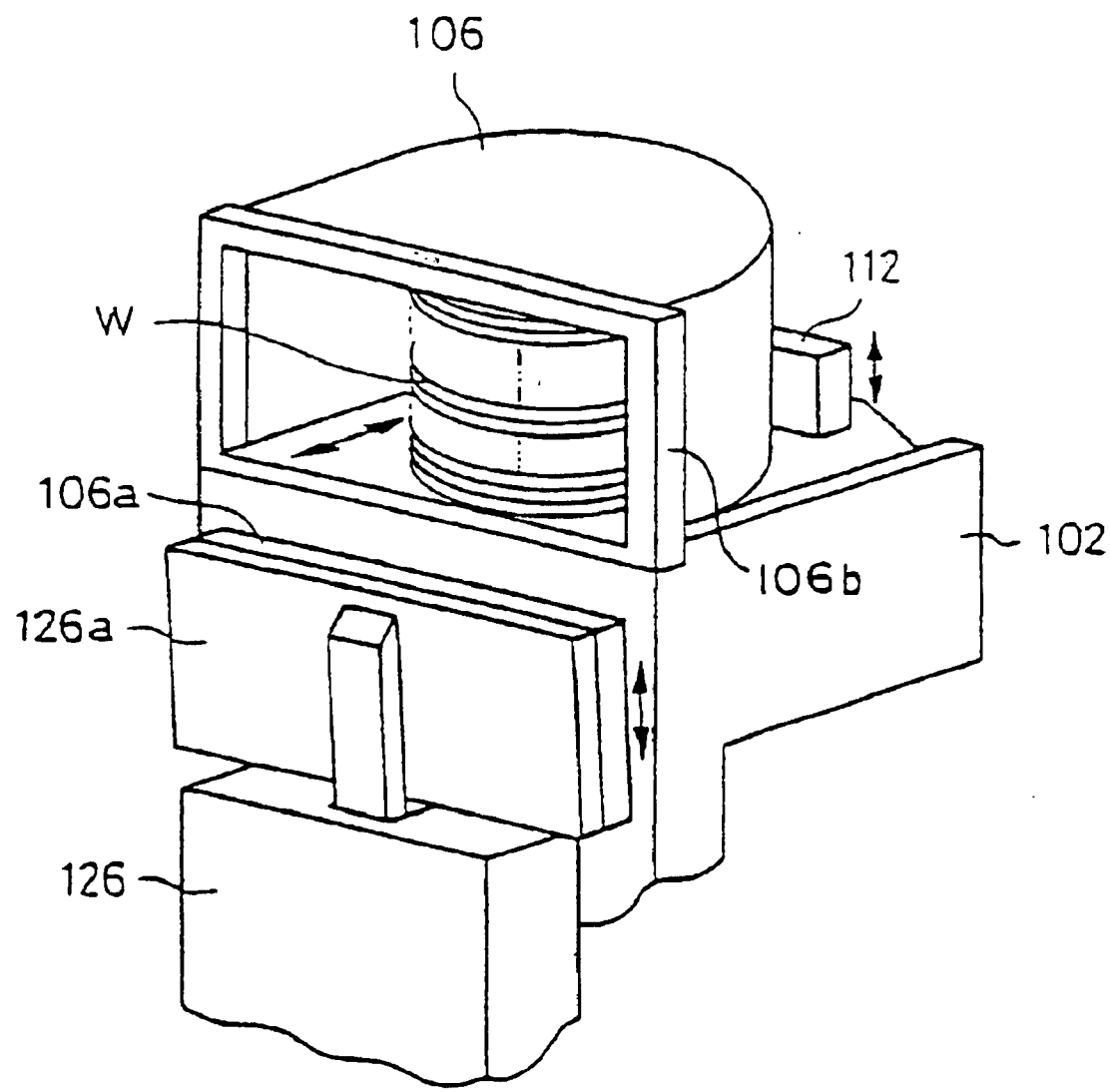
FIG. 4 is a schematic perspective view showing the load port and the cassette of FIG. 1.

In FIG. 1, the processing apparatus 100 is provided, on a first load port 102, with a plate 104 which is movable in the generally-horizontal direction. Mounted on the plate 104 is a open-and-close type (front-opening and unified-pot type) cassette 106, which can accommodate, for example, twenty-five pieces of wafers W with a diameter of 300 mm each. As shown in FIGS. 1 and 2, there are arranged, for example, three pins 108 on the plate 104. On the other hand, coping with the pins 108, a recess 110 is formed on the bottom of the cassette 106, as shown in FIG. 2. Further, as shown in FIGS. 1, 2 and 4, the first load port 102 has a stopper 112 arranged to urge the back of the cassette 106 mounted on the port 102 toward the outer face of an partitioning wall 122a of a first transfer chamber 122 mentioned later. In order to move the stopper 112 up and down, a not-shown driving mechanism is connected to the stopper 112. The cassette 106 is provided, on its front side, with an opening, to which a door 106a is detachably attached. The cassette 106 has a flange 106b formed on the periphery of the opening (see FIGS. 4 and 13A).

The processing apparatus 100 further includes a second load port 114, a third load port 116 and a fourth load port 118 all arranged adjacently in succession, substantially linearly together with the first load port 102. The structures of the ports 114, 116 and 118 are the same as the structure of the first load port 102. The first to fourth load ports 102, 114, 116 and 118 constitute a load port site 120. Additionally, as shown in FIG. 1, the first to fourth load ports 102, 114, 116 and 118 are arranged adjacently to the first transfer chamber 122, i.e., a first transfer space, respectively.

The first transfer chamber 122 is defined by a plurality of wall members. In these wall members, an partitioning wall 122a between the first transfer chamber 122 and the respective load ports insulates an atmosphere of the first transfer chamber 122 from respective atmospheres of the load ports.

Figure 3:
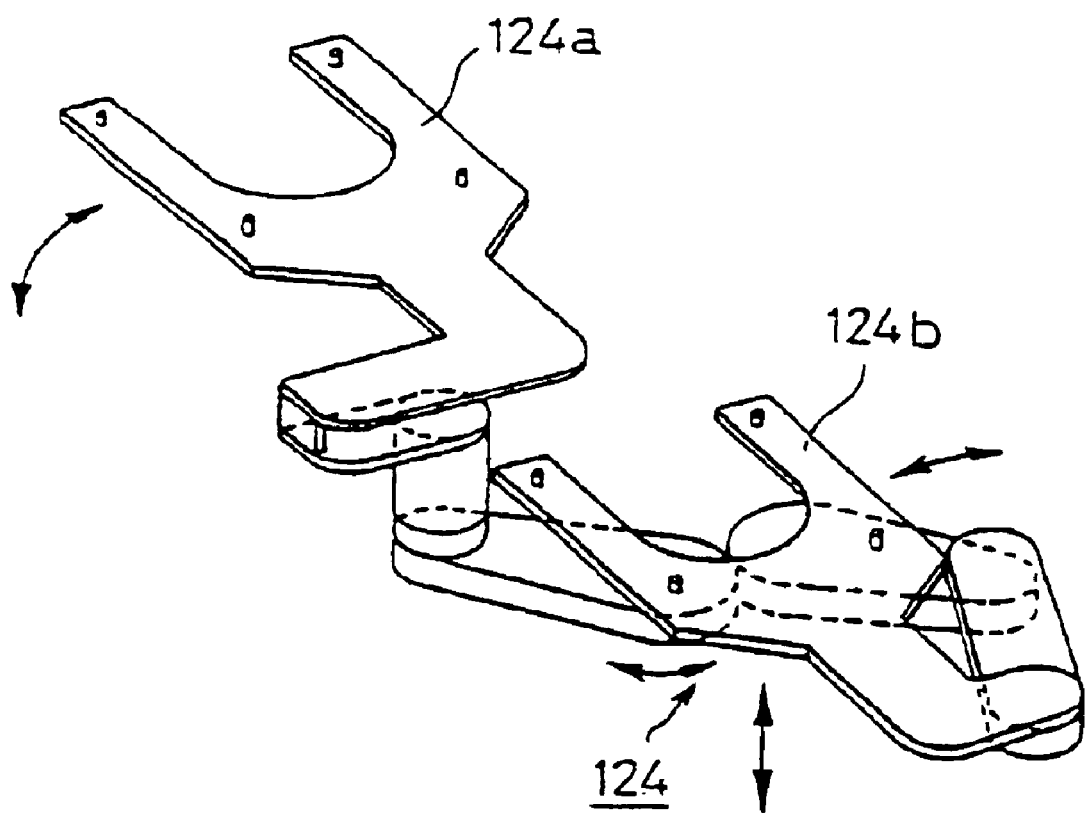
FIG. 3 is a schematic perspective view showing a first transfer arm of FIG. 1.

In the first transfer chamber 122, there is a first transfer unit 124 shown in FIGS. 1 to 3. The first transfer unit 124 is capable of carrying two wafers W simultaneously and transferring them independently. That is, as shown in FIG. 3, the first transfer unit 124 is formed by a pair of so-called "scalar" type (articulated) transfer arms having substrate holding parts (fork parts) 124a and 124b, respectively. The first and second substrate holding parts 124a and 124b are movable in the vertical and horizontal directions, mutually independently.

As shown in FIGS. 2 and 4, the first to fourth load ports 102, 114, 116 and 118 are provided, on the side of the first transfer chamber 122, with door openers 126, respectively. Each door opener 126 can open and close the detachable door 106a of the cassette 106 by a holding part 126a movable up and down.

A gas supply line for supplying $N_2$-gas as clean gas and a gas discharge line (both not shown) are together connected with the first transfer chamber 122. In this embodiment, $N_2$-gas is supplied from the top of the first transfer chamber 122 and discharged from the bottom of the chamber 122. The first transfer chamber 122 further includes a return line 128 connected thereto for circulation of $N_2$-gas, as shown in FIG. 1.

As shown in FIG. 1, a first load lock chamber 130 and a second load lock chamber 132 are together connected with the first transfer chamber 122. The first and second load lock chambers 130 and 132 are opposed to the load port site 120 respectively. Gate valves G1, G2 are interposed between the first load lock chamber 130 and the first transfer chamber 122 and between the second load lock chamber 132 and the first transfer chamber 122, respectively. Additionally, the first and second load lock chambers 130, 132 are connected with a second transfer chamber (vacuum transfer chamber) 133, i.e. a second transfer space. Gate valves G3, G4 are interposed between the first load lock chamber 130 and the second transfer chamber 133 and also between the second load lock chamber 132 and the second transfer chamber 133, respectively.

Figure 5A:
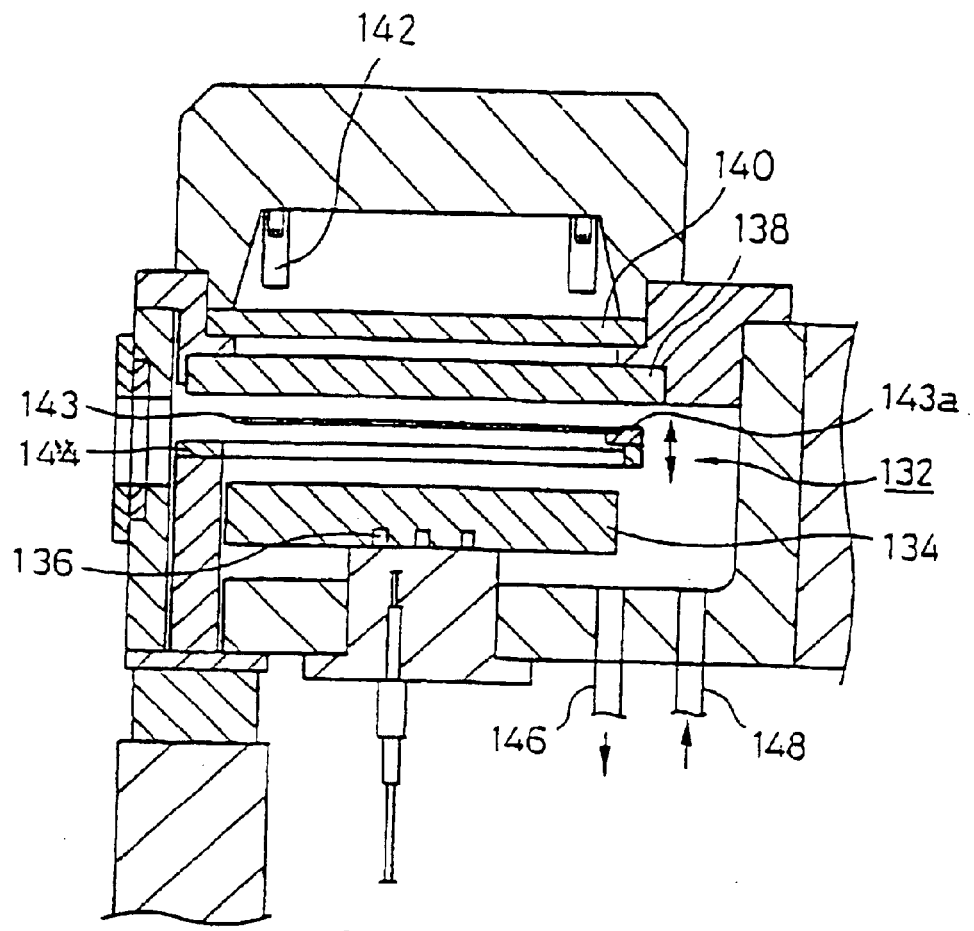
FIG. 5A is a schematic sectional view showing a load lock chamber of FIG. 1

The structures of the first and second load lock chambers 130 and 132 will be described. Note, since the first and second load lock chambers 130 and 132 are generally identical to each other in structure, the following descriptions are represented by the second load lock chamber 132. Arranged in the second load lock chamber 132 of FIG. 5A is a cooling plate 134, which also serves as a table for mounting the wafer W thereon. The cooling plate 134 is equipped with a built-in coolant circulation path 136 capable of circulating coolant of a designated temperature. On the upperpart of the second load lock chamber 132, a first glass plate 138 is arranged to form a part of ceiling of the second load lock chamber 132. Above the first glass plate 138, heating lamps 142 are arranged through a second glass plate 140, for heating the wafer W disposed in the second load lock chamber 132 to a designated temperature.

Figure 5B:
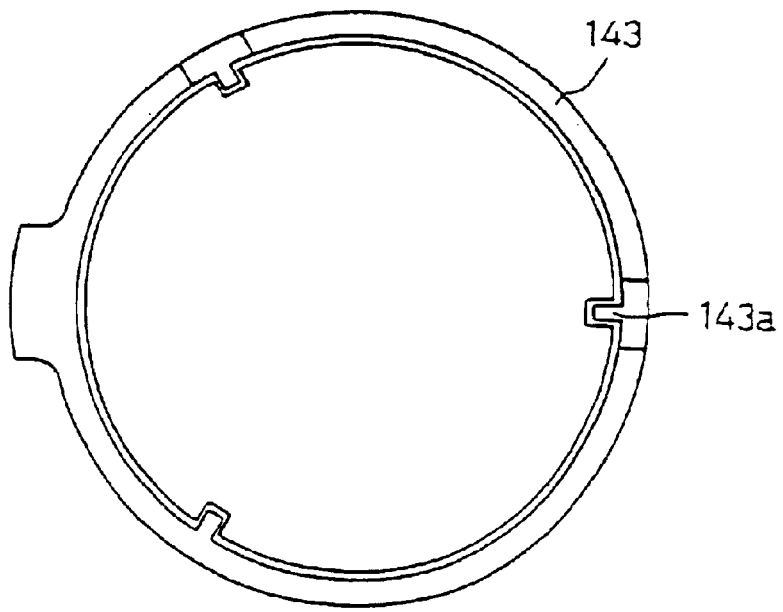
FIG. 5B is a schematic plan view showing a substrate holding part of FIG. 5A.

A substrate holder 143 capable of holding the wafer W is arranged in the second load lock chamber 132. The substrate holder 143 is disposed between the first glass plate 138 and the cooling plate 134. The substrate holder 143 is provided with an elevating mechanism 144 for moving the substrate holder 143 up and down. The substrate holder 143 connected with the elevating mechanism 144 is arranged between the first glass plate 138 and the cooling plate 134. As shown in FIG. 5B, the substrate holder 143 is shaped to be generally annular and has its inner diameter larger than the outer diameter of the cooling plate 134. Attached to the substrate holder 143 at three positions thereon are three holder pins 143a, which support the wafer W thereon. An exhaust pipe 146 for forming a vacuum in the second load lock chamber 132 and a gas supply pipe 148 for supplying the second load lock chamber 132 with gas are connected with the second load lock chamber 132. The second load lock chamber 132 has a minimum volume capable of accommodating only one wafer W, for example, the order of 5 liters.

Figure 6:
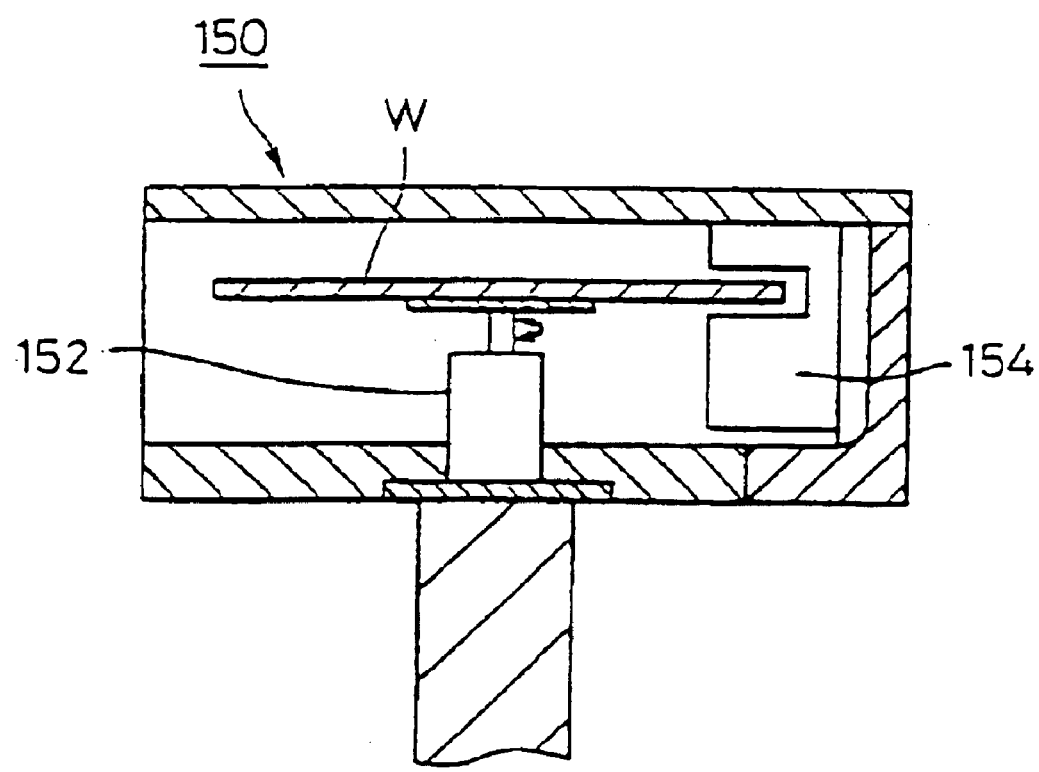
FIG. 6 is a schematic sectional view showing an object-positioning unit of FIG. 1.

Referring to FIG. 1 again, an object positioning unit 150 communicating with the first transfer chamber 122 is arranged between the first load lock chamber 130 and the second load lock chamber 132. The positioning unit 150 is opposed to the load port site 120 and arranged below the intermediate position between the first load lock chamber 130 and the second load lock chamber 132. In the positioning unit 150, as shown in FIG. 6, there are provided a rotating mechanism 152 for rotating the wafer W and a sensor 154 for detecting the position of the wafer W.

Figure 7:
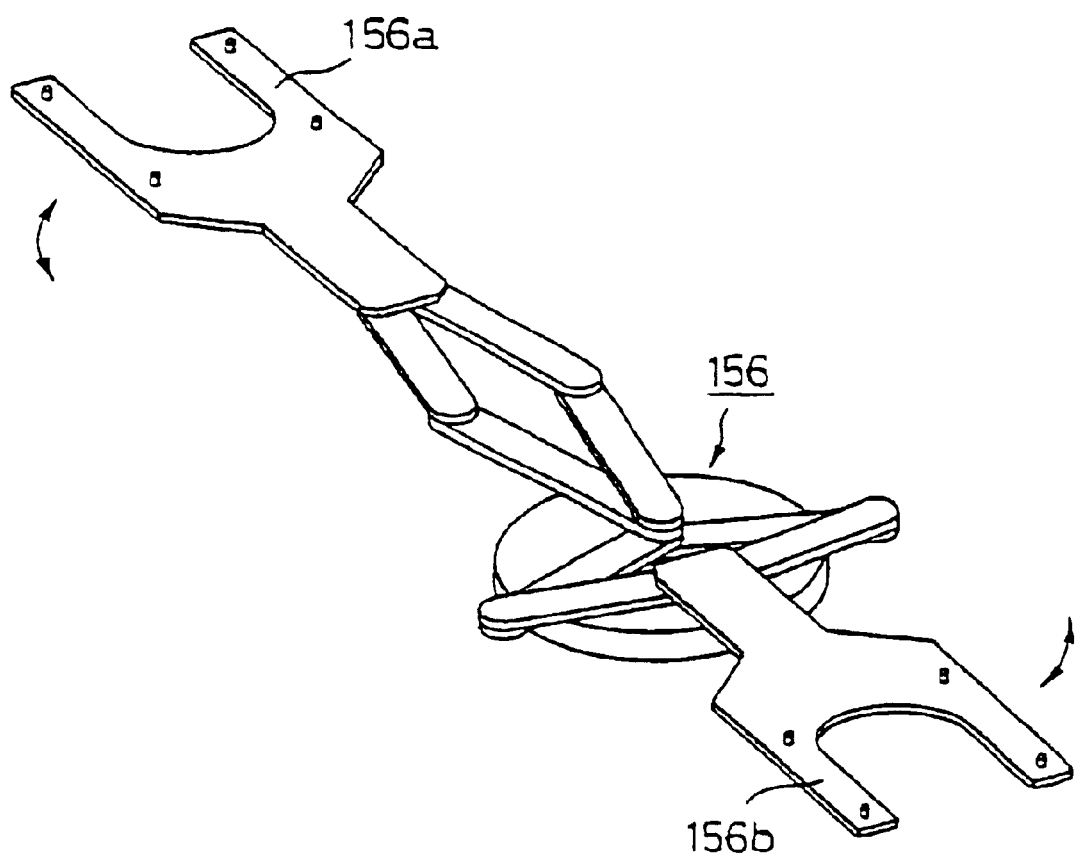
FIG. 7 is a schematic perspective view showing a second transfer arm of FIG. 1.

Further, a second transfer unit 156 is arranged in the second transfer chamber 133 shown in FIG. 1. The second transfer unit 156 is capable of retaining two wafers W simultaneously and also transferring the wafers W independently. That is, the second transfer unit 156 has a pair of "frog-leg" type transfer arms equipped with first and second substrate holders (fork parts) 156a and 156b, as shown in FIG. 7. The first substrate holder 156a and the second substrate holder 156b are movable in the designated horizontal directions, independently of each other. A not-shown exhausting mechanism is connected with the interior of the second transfer chamber 133, allowing the atmosphere in the second transfer chamber 133 to be discharged.

First to fourth vacuum processing chambers 158, 160, 162 and 164 are connected with the periphery of the second transfer chamber 133. In the shown embodiment, the first to fourth vacuum processing chambers 158, 160, 162 and 164 define processing chambers of plasma CVD apparatus for performing film depositing processes, respectively. Gate valves G5, G6, G7 and G8 are interposed between the first to fourth vacuum processing chambers 158, 160, 162, 164 and the second transfer chamber 133, respectively. A partition plate 166 insulates the first to fourth load ports 102, 114, 116 and 118 from the first transfer chamber 122, the first and second load lock chambers 130, 132, the positioning unit 150, the second transfer chamber 133 and the first to fourth vacuum processing chambers 158, 160, 162 and 164 in an airtight manner. The atmospheres of the first to fourth load ports 102, 114, 116 and 118 to which the cassette 106 is transported are identical to the atmosphere of a clean room.

(2) Processing Order

Next, the processing order to apply film deposition on the wafers W by the above-mentioned processing apparatus 100 will be described with reference to FIGS. 1 to 12. The following descriptions of the processing steps take example by the film deposition process executed in only the first and fourth vacuum processing chambers 158 and 164 for ease of understanding.

First, respective terms used in the timing charts for the processing steps shown in FIGS. 8 to 12 will be described.

(a) L-Port: one of the first to fourth load ports 102, 114, 116 and 118

(b) L-Arm: the first transfer unit 124 (The first and second substrate holders 124a and 124b are represented by P1 and P2, respectively.)

(c) Ort: the object positioning unit 150

(d) LL1: the first load lock chamber 130

(e) LL2: the second load lock chamber 132

(f) T-Arm: the second transfer unit 156 (The first and second substrate holders 156a and 156b are represented by P1 and P2, respectively.)

(g) PM1: the first vacuum processing chamber 158

(h) PM2: the fourth vacuum processing chamber 164

(I) #1-#n: serial number of the wafers W (j) Door Open: opening the door 106a of the cassette (k) Door Cls: closing the door 106a of the cassette (l) Map: mapping of the wafer W in the cassette 106

Figure 10:
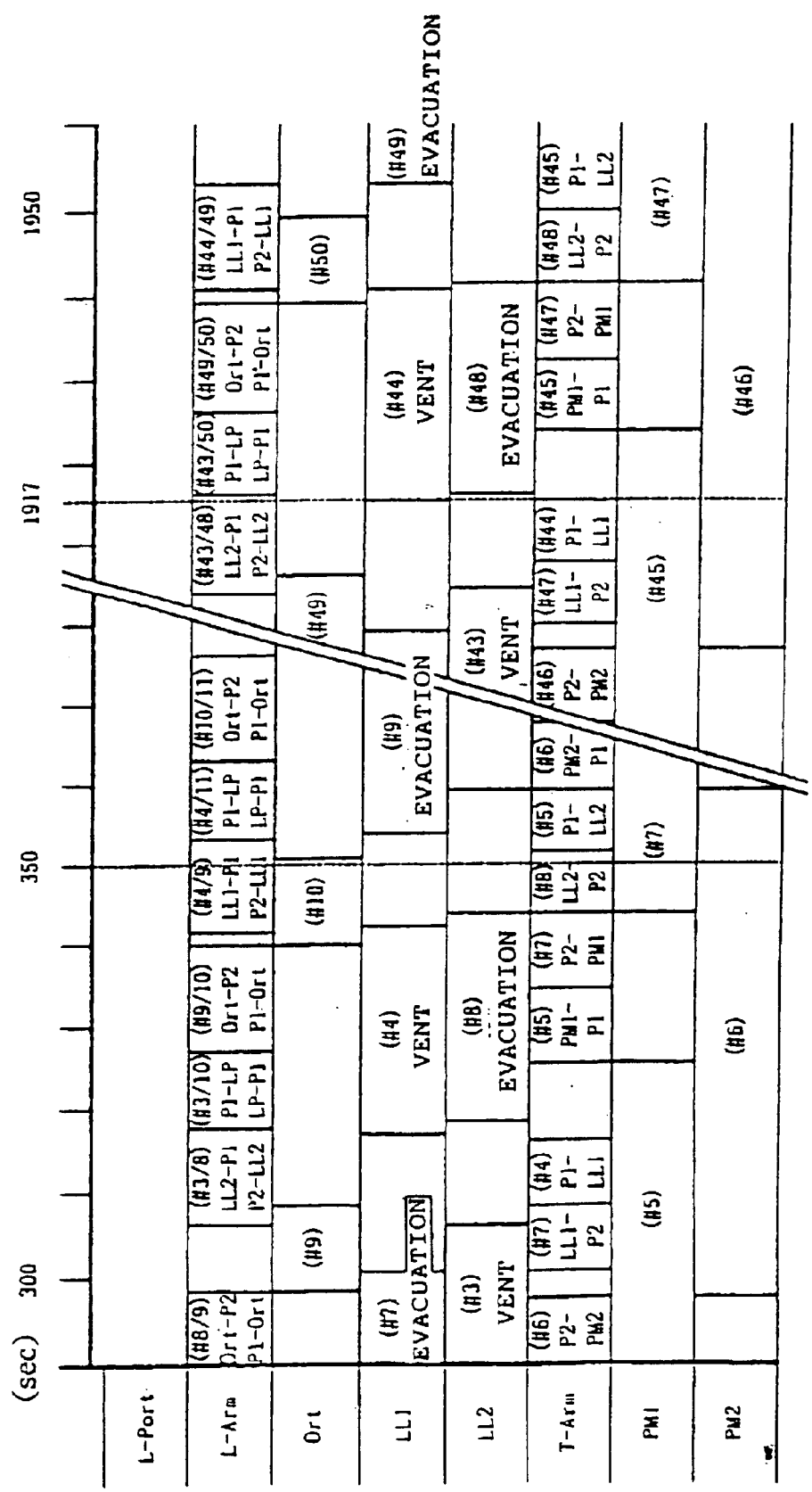
FIG. 10 is a schematic timing chart showing the processing process of the processing apparatus of FIG. 1.
Figure 11:
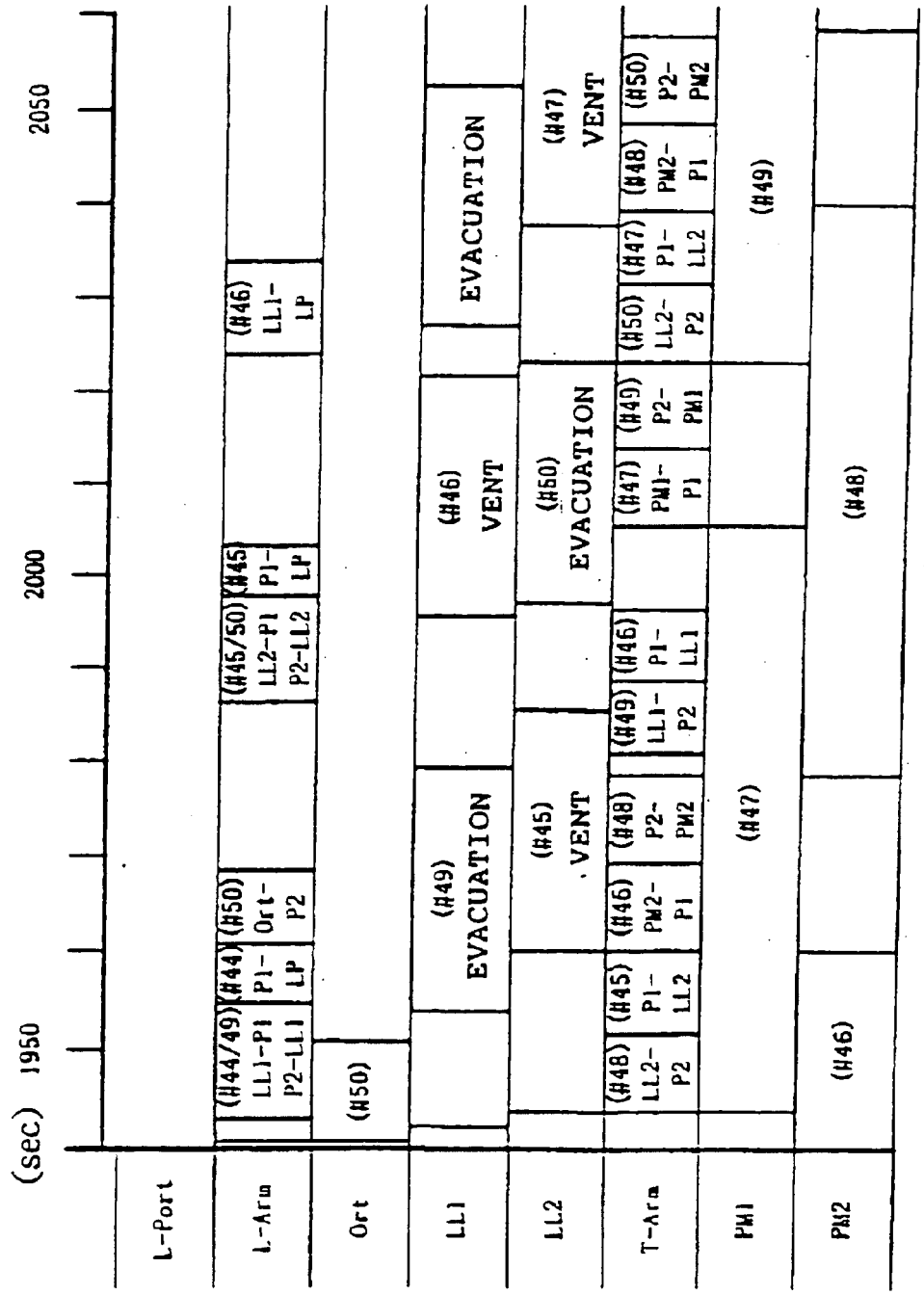
FIG. 11 is a schematic timing chart showing the processing process of the processing apparatus of FIG. 1.

Note, "XXX-YYY" in both L-Arm process and T-Arm process represents to transport the wafer W from XXX to YYY. For example, "LP-P1" means that the wafer W is transported from any one of the first to fourth load ports 102, 114, 116 and 118 to the first substrate holder 124a. Further, since the substantially-identical operations are repeated in the period between 350 sec. and 1917 sec., the processing contents are abbreviated as shown in FIG. 10.

Next, referring to the timing charts of FIGS. 8 to 12, the processing steps will be described.

As shown in FIG. 1, it is firstly executed to mount the cassette 106 having the unprocessed wafer W accommodated therein, for example, on the plate 104 of the third load port 116 so that the pins 108 are engaged in the recess 110. Then, the plate 104 moves to the first transfer chamber 122. Thereafter, with the rise of the stopper 112, the cassette 106 is urged and fixed to the outer face of the partitioning wall 122a, as shown in FIGS. 1, 2 and 4. Since the cassette 106 is fixed in the above way, a pressure in the first transfer chamber 122 is established higher than a pressure in the clean room where the first to fourth load ports 102, 114, 116 and 118 are arranged, owing to the circulation of $N_2$-gas in the chamber 122. Therefore, even if a force of the order of e.g. 100 g to 1 kg is applied on the cassette 106, it is possible to fix the cassette 106 in position.

The following steps are carried out as shown in FIGS. 8 to 12, in sequence. Hereafter, we describe the actions of the first and second transfer units 124 and 156 and the first and second load lock chambers 130 and 132 mainly.

Figure 8:
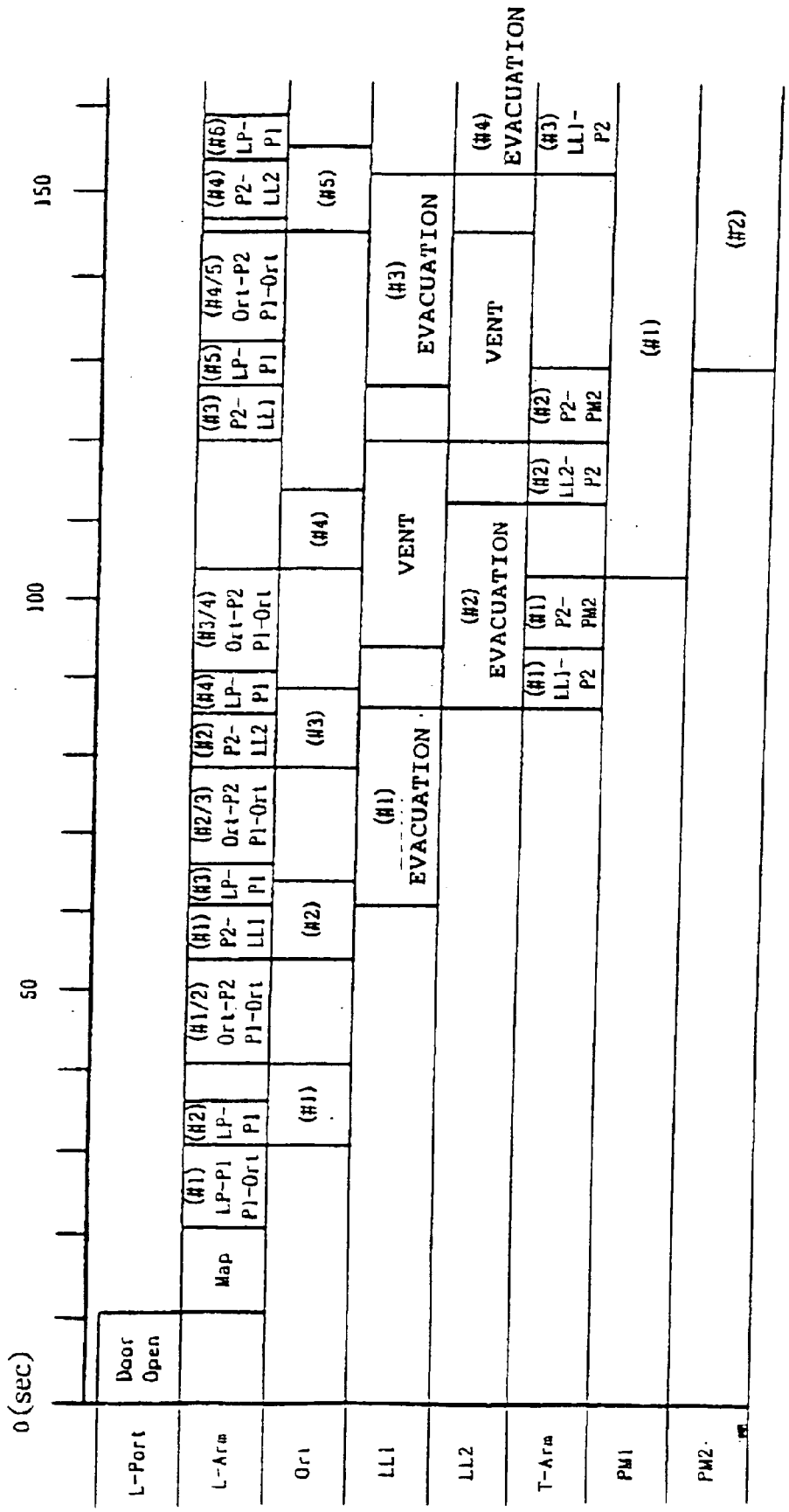
FIG. 8 is a schematic timing chart showing a processing process of the processing apparatus of FIG. 1.

Upon positioning the cassette 106 in the above way, at the step of FIG. 8, the holding part 126a of the door opener 126 hooks the door 106a and detaches it from the cassette 106, as shown in FIGS. 2 and 4. In this state, the interior of the cassette 106 is communicated with the first transfer chamber 122 through a window 122b, i.e. a communication port, formed in the partitioning wall 122a. Then, the outer face of the partitioning wall 122a engages with the flange 106b of the cassette 106 tightly.

Subsequently, a not-shown mapping sensor of the first transfer unit 124 carries out mapping in order to search both number and arrangement of the wafers W accommodated in the cassette 106. After completing the mapping, the first transfer unit 124 transports the wafer W in the cassette 106 to the object positioning unit 150 as shown in FIGS. 1 and 2, and the positioning unit 150 further carries out the positioning of the wafer W as shown in FIG. 6.

Next, the aligned wafer W is mounted on the substrate holder 143 in, for example, the first load lock chamber 130 by the first transfer unit 124 again. At this time, the interior of the first load lock chamber 130 is maintained with an atmosphere of substantial atmospheric pressure since the gate valve G1 is opened while the gate valve G3 is closed. Thereafter, the gate valve G1 is closed to discharge the atmosphere in the first load lock chamber 130, so that the pressure of the atmosphere in the first load lock chamber 130 is lowered to be generally equal to the pressure of the atmosphere in the second transfer chamber 133, for example, 100 mTorr. At the same time, the wafer W on the substrate holder 143 is elevated relatively to approach the heating lamps 142 and simultaneously, they are lighted to heat the wafer W on the substrate holder 143 to a designated temperature, for example, 500° C. Note, even when the above-aligned wafer W is transported into the second load lock chamber 132, there are performed respective processing steps similar to the above-mentioned steps.

After the interior of the first load lock chamber 130 has reached the designated atmosphere of reduced pressure and also the wafer W has been heated to the predetermined temperature, the gate valve G3 is opened, so that the second transfer unit 156 takes the wafer W out of the first load lock chamber 130 and further loads the wafer W into the first vacuum processing chamber 158. Thereafter, the gate valve G5 is closed and the first vacuum processing chamber 158 is supplied with, for example, $WF_6$ and $H_2$. In this state, the wafer W is heated in the first vacuum processing chamber 158 by the lamps to form e.g. tungsten thin film on the wafer W.

After being unloaded from the first vacuum processing chamber 158, the wafer W having the thin film formed thereon is mounted on the substrate holder 143 by the second transfer unit 156. Then, the interior of the second load lock chamber 132 is maintained at a pressure reduced atmosphere substantially equal to that of the interior of the second transfer chamber 133 since the gate valve G4 is opened while the gate valve G2 is closed. Thereafter, the gate valve G4 is closed to supply the second load loch chamber 132 with gas, for example, $N_2$-gas, so that the pressure of the atmosphere in the second load lock chamber 132 is increased to be generally equal to the pressure of the atmosphere in first transfer chamber 122. At the same time, the substrate holder 143 is lowered relatively to mount the wafer W on the cooling plate 134, for cooling the wafer W to a designated temperature, for example, 70° C. Note, even when the wafer W is transported into the first load lock chamber 130, there are performed respective processing steps similar to the above-mentioned steps.

Figure 12:
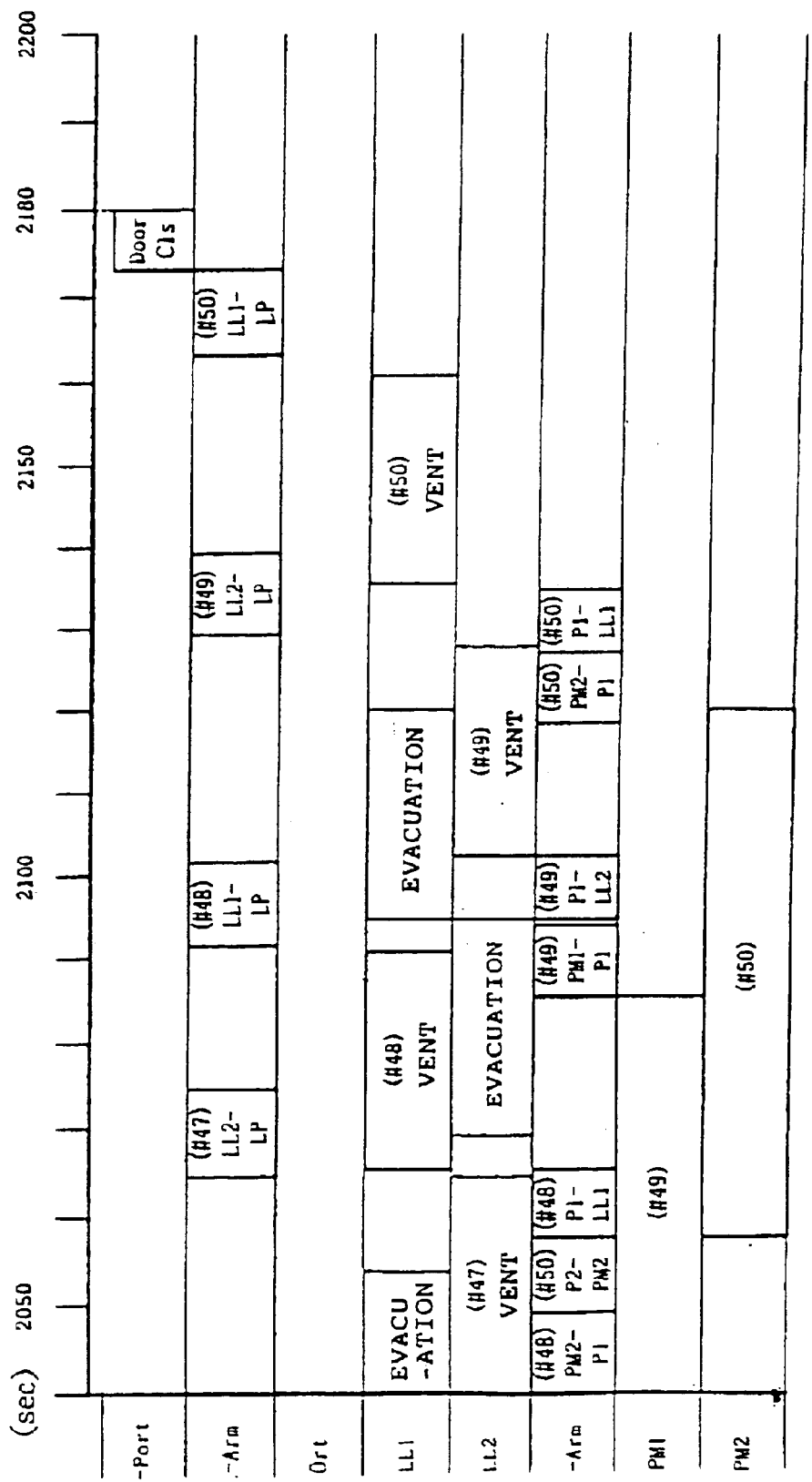
FIG. 12 is a schematic timing chart showing the processing process of the processing apparatus of FIG. 1.

After the interior of the second load lock chamber 132 has reached the atmospheric pressure and also the wafer W has been cooled to the predetermined temperature, the gate valve G2 is opened, so that the first transfer unit 124 transfers the wafer W in the second load lock chamber 132 to the first transfer chamber 122 and further loads the wafer W into the cassette 106 again. When all the processed wafers W are collected into the cassette 106, as shown in FIG. 12, the holding part 126b of the door opener 126 rises to attach the door 106a to the cassette 106. Next, the stopper 112 is lowered and the plate 104 moves back to the position to detach the cassette 106.

Each unit forming the processing apparatus 100 operates as above. In this embodiment, several units operate simultaneously and in combination, as shown in FIGS. 8 to 12. For example, at a point of time over 150 sec. from the processing start shown in FIG. 8, there are simultaneously carried out the transportation of the wafer W by the first transfer unit 124, the positioning of the wafer W by the object positioning unit 150, both evacuation and heating of the wafer W in the first load lock chamber 130 and the film deposition in the first and fourth vacuum processing chambers 158 and 164. Additionally, at a point of time over 250 sec. from the processing start shown in FIG. 9, there are simultaneously carried out the transportation of the wafer W by the first transfer unit 124, the supply of the first load lock chamber 130 with $N_2$-gas and the cooling of the wafer W in the same chamber, both evacuation and heating of the wafer W in the second load lock chamber 132, the transportation of the wafer W by the second transfer unit 156 and the film deposition in the fourth vacuum processing chamber 164.

Accordingly, since the processing apparatus 100 of the embodiment is capable of transporting the wafers W in succession thereby to apply the designated processing on four wafers simultaneously, it is possible to improve the throughput of the apparatus.

In the above-mentioned embodiment, since each of the first and second load lock chambers 130 and 132 has a minimum volume capable of accommodating only one wafer, it is possible to perform both evacuation and gas supply of the first and second load lock chambers 130 and 132 promptly, shortening a period required for adjusting the pressure of the first and second load lock chambers 130 and 132. Consequently, a period to deliver the wafer W between the first transfer unit 124 and the second transfer unit 156 can be shortened to improve the throughput of the apparatus. Further, since the first transfer unit 124 and the second transfer unit 156 are provided with the first and second substrate holders 124a, 124b and the first and second substrate holders 156a, 156b respectively, it is possible to perform the delivery/replacement of the wafer W promptly and further possible to improve the throughput of the apparatus in spite of the formation of the first and second load lock chambers 130, 132 of single wafer type.

Further, since the object positioning unit 150 is arranged in the vicinity of the first transfer chamber 122 and the heating and cooling units of the wafer W are arranged in the first and second load lock chambers 130 and 132, it is possible to reduce the number of wafer deliveries by the second transfer unit 156, improving the throughput of the apparatus. Additionally, since the object positioning unit 150 is disposed in a position between first load lock chamber 130 and the second load lock chamber 132, it is possible to shorten the transporting distance among the object positioning unit 150, the first to fourth load ports 102, 114, 116 and 118, and the first and second load lock chambers 130 and 132. The resulting narrowed transporting area of the first transfer unit 124 allows the transporting period to be shortened and the first transfer chamber 122 to be small-sized. Since the cassette 106 is fixed by the stopper 112, it is possible to prevent the cassette 106 from slipping out of place or falling from the first to fourth load ports 102, 114, 116 and 118 during the loading/unloading of the wafer W.

Although the preferred embodiment of the present invention has been described with reference to the attached drawings, the invention is not limited to the above-mentioned structure only. It will be understood that various changes and modifications may be made by those skilled in the art without departing from the present technical spirit in the scope of claims of the invention.

Figure 13A:
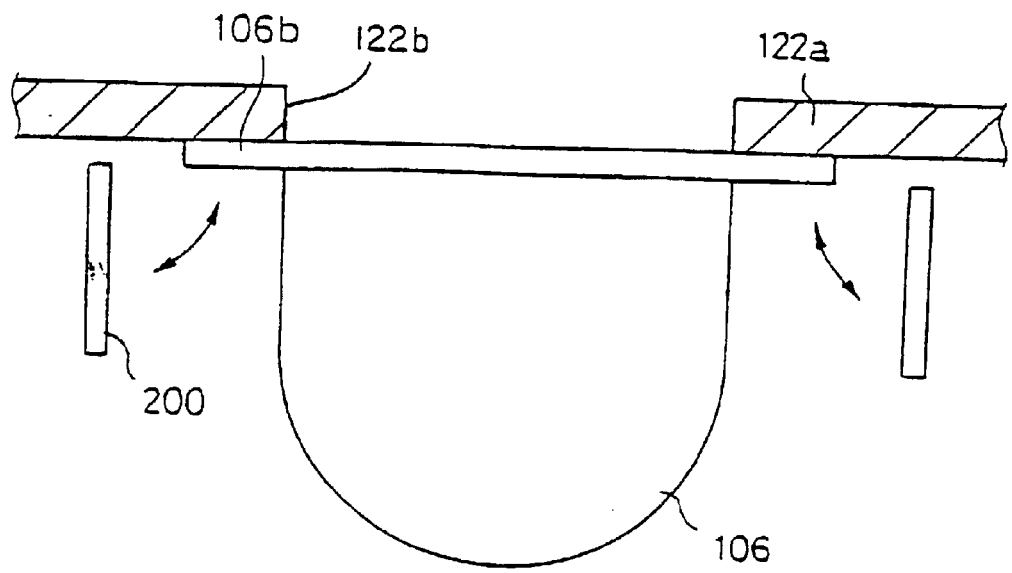
FIGS. 13A and 13B are schematic explanatory views for explanation of another stopper applicable to the processing apparatus of FIG. 1 where
Figure 13B:
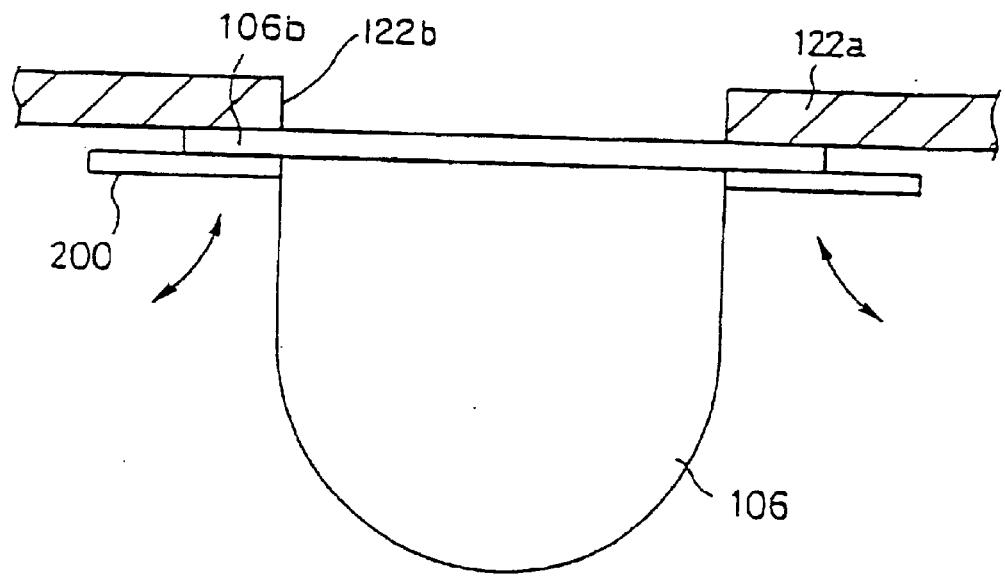

Although the above embodiment has been described by an example where the stopper urges the back face of the cassette against the outer wall of the first transfer chamber, the invention is not limited to this arrangement. For example, as shown in FIG. 13A, each of the first to fourth load ports 102, 114, 116 and 118 may be provided with a stopper 200 which is movable in the circumferential direction to urge the flange part 106b formed close to the door 106a of the cassette 106 against the partitioning wall 122a of the first transfer chamber 122 when fixing the cassette 106, as shown in FIG. 13B.

Figure 14:
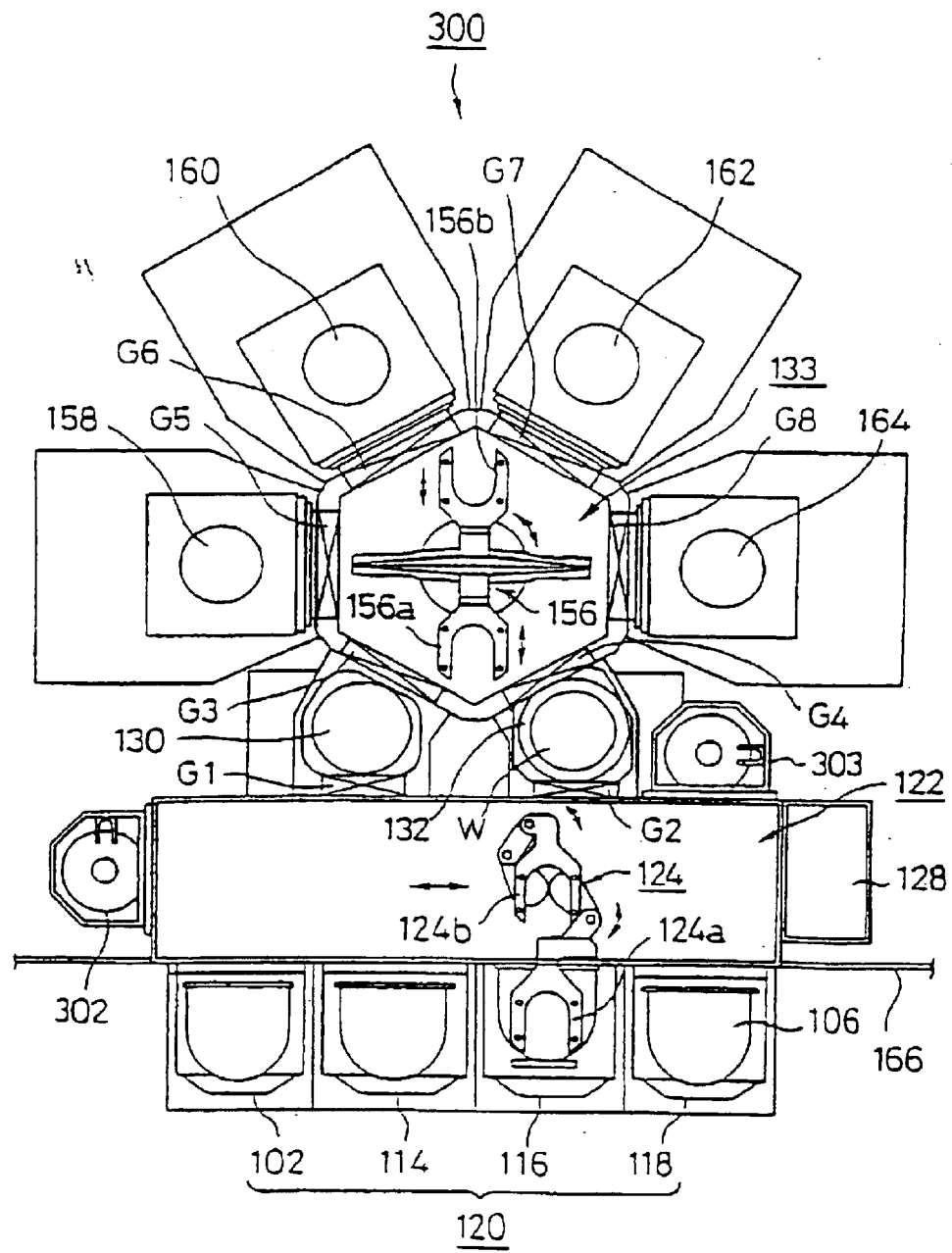
FIG. 14 is a schematic explanatory view showing another multi-chamber type processing apparatus to which the present invention is applicable.

In the above-mentioned embodiment, the positioning unit is interposed between the first load lock chamber and the second load lock chamber. In the modification, as shown in FIG. 14, there can be provided a positioning unit 302 at one end of the first transfer chamber 122 in the moving direction of the first transfer unit 124 (i.e. position adjacent to the left end of the first transfer chamber 122 in FIG. 14) and another positioning unit 303 at another end of the first transfer chamber 122 in a direction perpendicular to the moving direction of the unit 124 (i.e. position opposite to the fourth load port 118 over the first transfer chamber 122 in FIG. 14).

Additionally, with no limitation to 25 pcs. of wafers accommodated in the cassette, any number of wafers may be accommodated in the cassette.

Each of the first and second transfer units may be adapted so as to be able to carry three or more objects to be processed.

In the above-mentioned embodiment, the first transfer unit adopts the "scalar" type transfer arm, while the second transfer unit adopts the "frog-leg" type transfer arm. In the modification, the "frog-leg" type transfer unit may be employed as the first transfer unit while adopting the "scalar" type transfer unit as second transfer unit. Alternatively, both of the first and second transfer units may be together formed by the "scalar" type transfer units or the "frog-leg" type transfer units.

Without limiting to $N_2$-gas for circulation of the first transfer chamber, it may be circulated with clean gas of various kinds, such as fresh air and various inert gases.

Moreover, although the processing apparatus of the above embodiment has four load ports, two load lock chambers and four vacuum processing chambers, these elements may be provided in plural number, respectively. Without limiting to the single positioning unit, the apparatus may be provided with two or more positioning units.

In the above embodiment, all the first to fourth vacuum processing chambers are formed as processing chambers for a CVD apparatus, which perform the same film-deposition process respectively. Of course, these vacuum processing chambers may be constructed as processing chambers for performing different film-deposition processes in the CVD apparatus. Alternatively, these vacuum processing chambers may be provided for a variety of plasma processing systems, such as etching system and ashing system.

DETAILED DESCRIPTION OF ADVANTAGEOUS EFFECTS OF THE INVENTION

Figure 9:
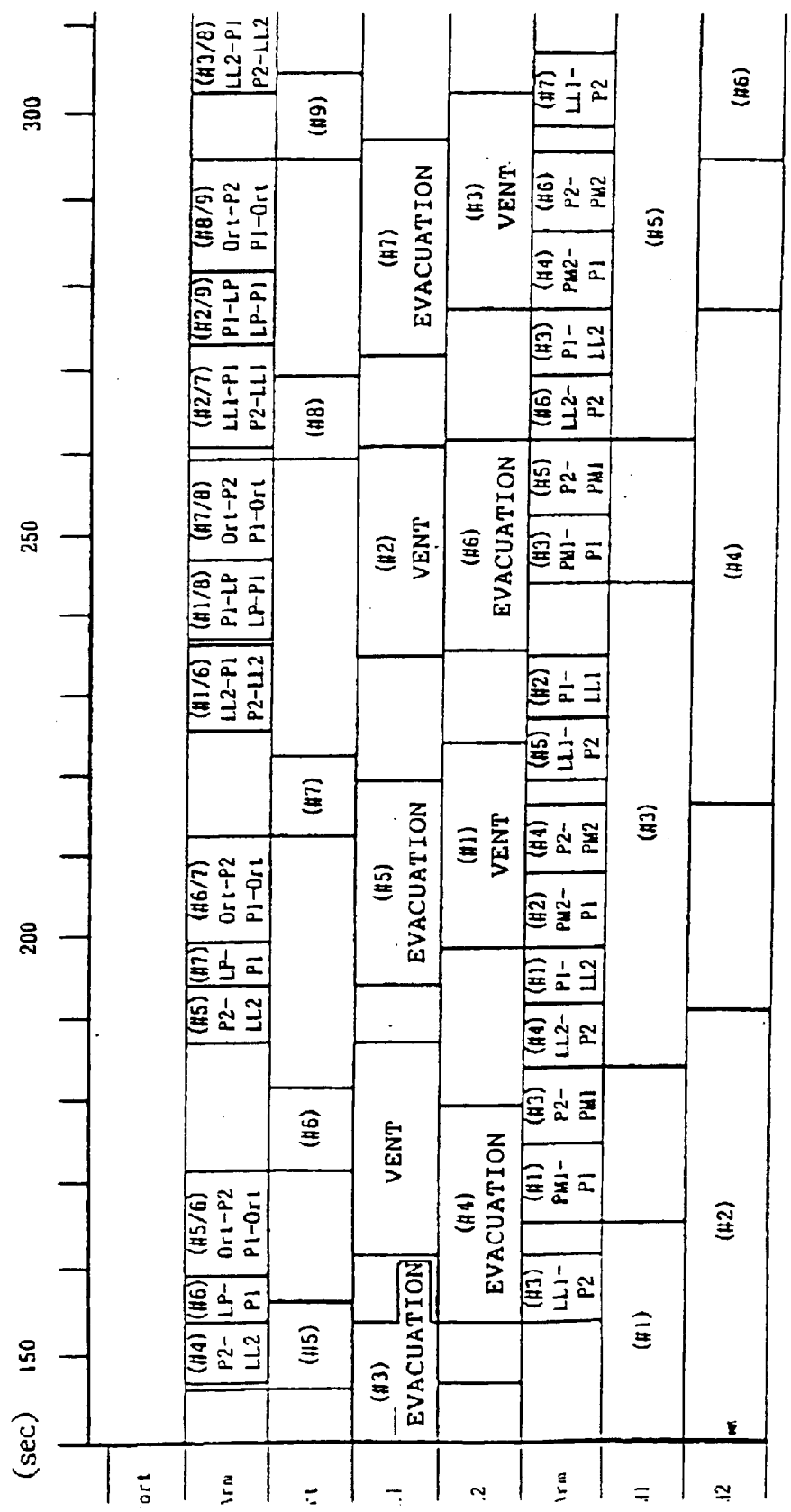
FIG. 9 is a schematic timing chart showing the processing process of the processing apparatus of FIG. 1.
Figure 15:
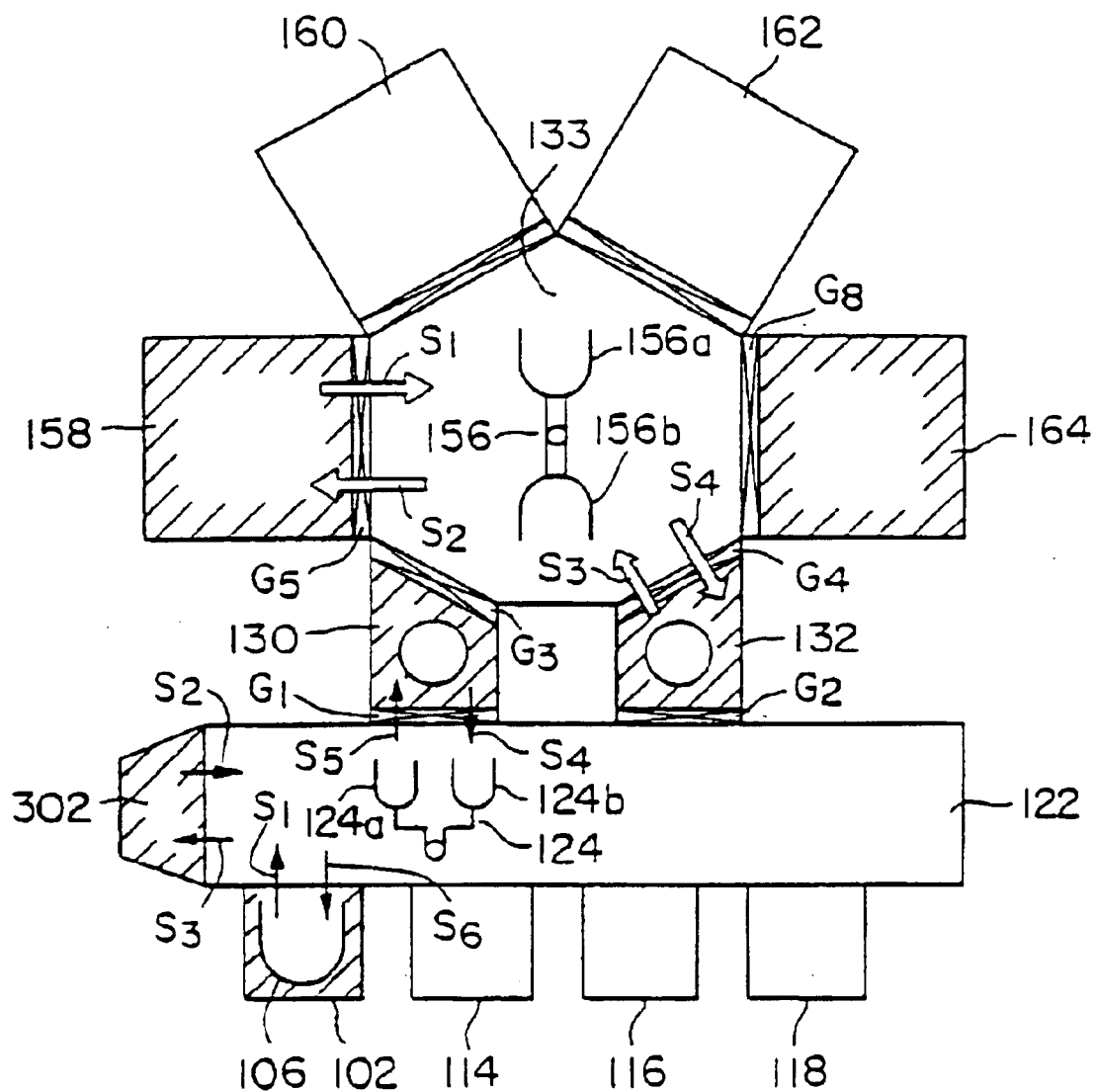
FIG. 15 is a view for explanation of the effect of the present invention, also showing both constitution and operation of the processing apparatus of the embodiment.
Figure 16:
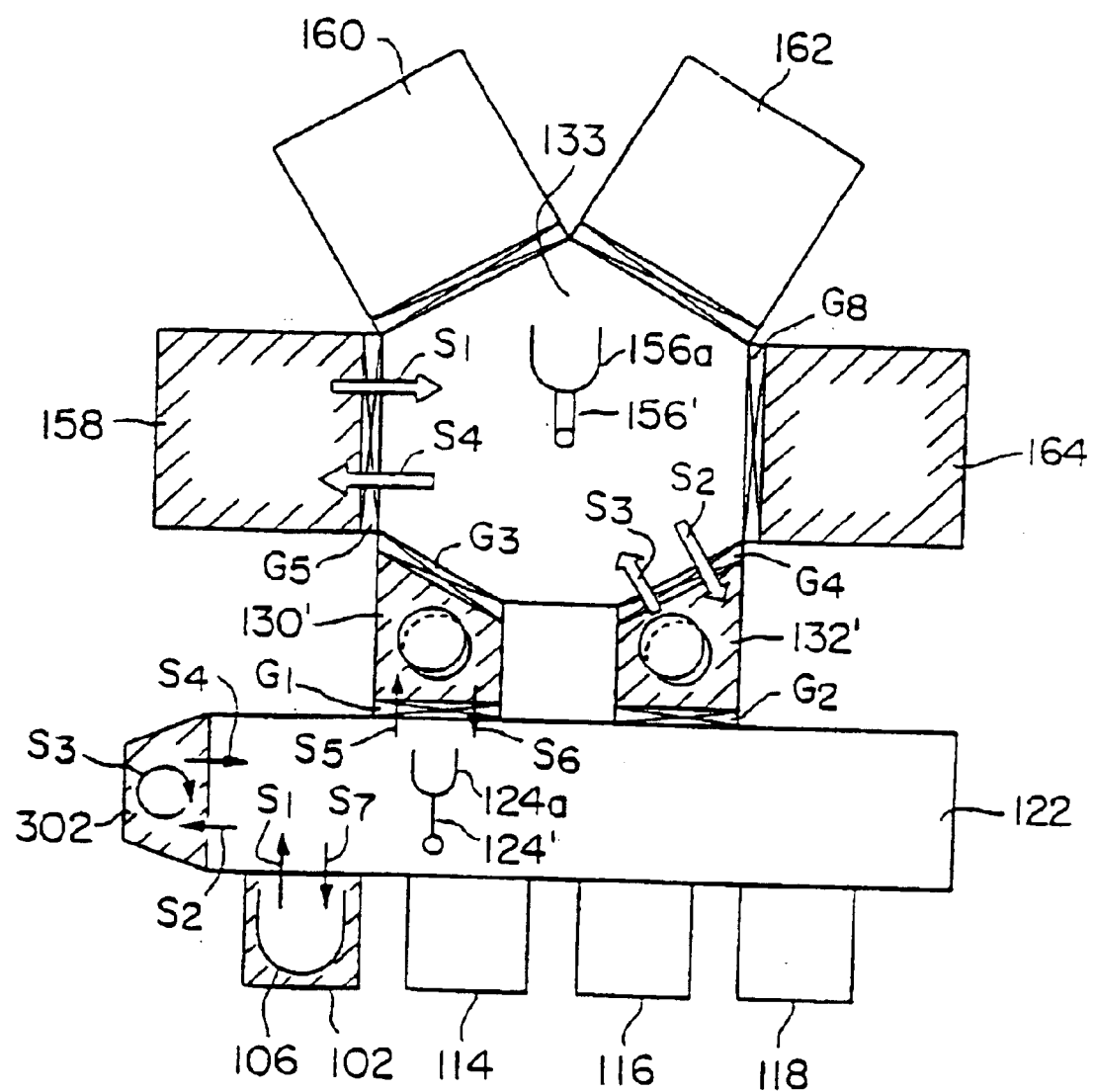
FIG. 16 is a view for explanation of the effect of the present invention, also showing both constitution and operation of the processing apparatus in the first comparative example.
Figure 17:
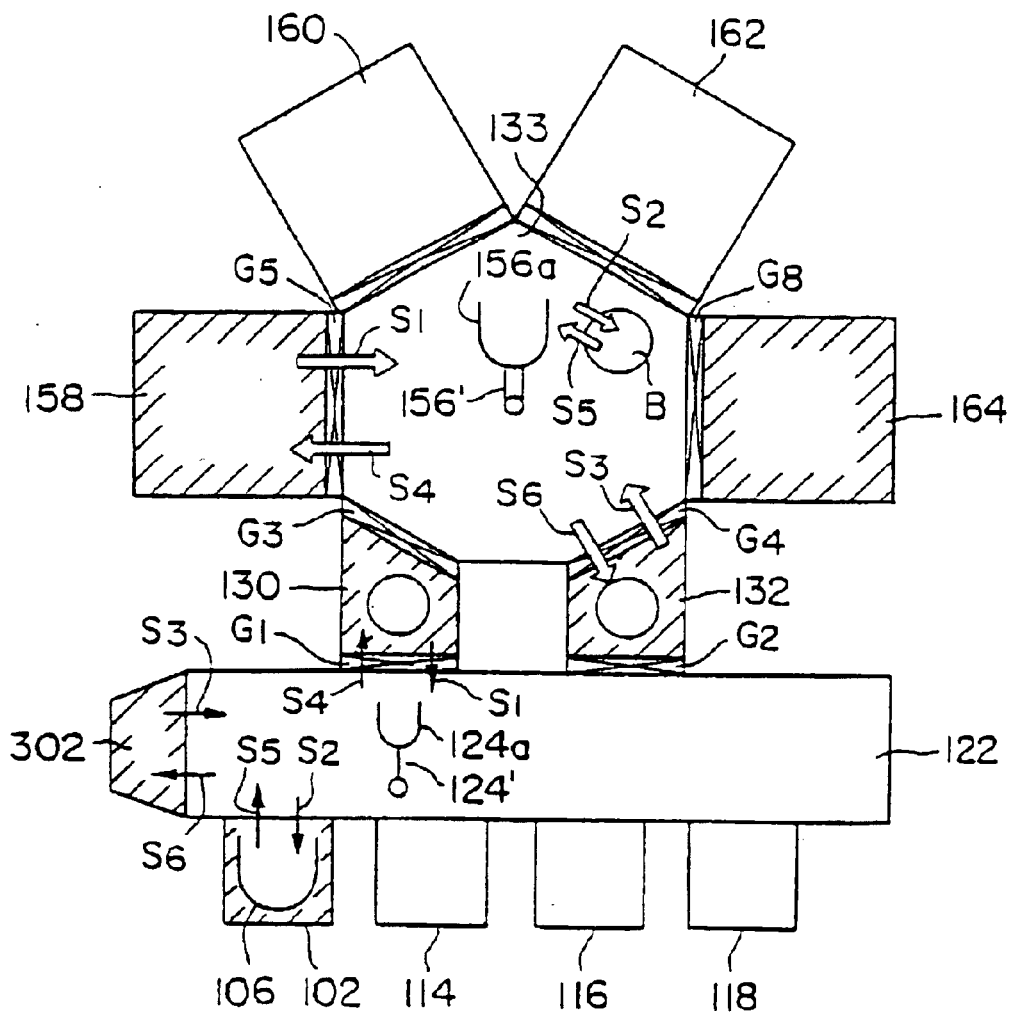
FIG. 17 is a view for explanation of the effect of the present invention, also showing both constitution and operation of the processing apparatus in the second comparative example.

Next, for detailed description of advantageous effects of the invention, the order from unloading of the unprocessed wafer W out of the cassette until loading the processed wafer into the cassette again will be described with reference to the processing charts of FIGS. 8 to 10 and also FIGS. 15 to 17. In FIGS. 15 to 17, members related to the operations are represented by hatching.

Embodiment of the Invention

First, the operation in the embodiment will be described with reference to FIG. 15. FIG. 15 is a schematic operational view corresponding to FIG. 14.

Operations in Relation with the First Transfer Unit 124

First, the operations related to the first transfer unit 124 will be described. Note, the following actions can be understood with reference to the operations on and after 240 seconds of the timing chart in FIG. 9.

Step 1: The first substrate holder 124a takes the unprocessed wafer W (#8) out of the cassette 106 (LP-P1).

Step 2: The first transfer unit 124 moves to the front of the positioning unit 302 and the second substrate holder 124b takes the aligned unprocessed wafer W (#7) out of the positioning unit 124 (Ort-P2).

Step 3: The first substrate holder 124a loads the unprocessed wafer W (#8) into the positioning unit 302 (P1-Ort).

Step 4: The first transfer unit 124 moves to the front of the first load lock chamber 130 and the first substrate holder 124a takes the processed wafer W (#2) out of the first load lock chamber 130 (LL1-P1).

Step 5: The second substrate holder 124b loads the unprocessed wafer W (#7) into the first load lock chamber 130 (P2-LL1).

Step 6: The first transfer unit 124 moves to the front of the cassette 106 and the first substrate holder 124a loads the processed wafer W (#2) into the cassette 106 (P1-LP).

These steps 1 to 6 are shown with black arrows in FIG. 15. These steps 1 to 6 as one cycle are carried out any number of cycles repeatedly. Note, if the wafer W is taken in and out of the first load lock chamber 130 at steps 4 and 5 in a certain cycle, the wafer W will be taken in and out of the second load lock chamber 132 at steps 4 and 5 in the sequent cycle.

In this operation, the total of time required at steps 2 and 3 amounts to 13 seconds, the total of time required at steps 4 and 5 amounts to 12 seconds and the total of time required at steps 6 and 1 amounts to 10 seconds. Accordingly, a time T1 required for the operation of one cycle (steps 1 to 6) of the first transfer unit 124 amounts to 35 seconds.

Operations in Relation with the Second Transfer Unit 156

Next, the operations related to the second transfer unit 156 will be described. Note, the following actions can be understood with reference to the operations on and after 240 seconds of the timing chart in FIG. 9.

Step 1: The first substrate holder 156a takes the processed wafer W (#3) out of the first vacuum processing chamber 158 (PM1-P1).

Step 2: The second substrate holder 156b loads the unprocessed wafer W (#5) into the first vacuum processing chamber 158 (P2-PM1).

Step 3: The second substrate holder 156b takes the unprocessed wafer W (#6) out of the second load lock chamber 132 (LL2-P2).

Step 4: The first substrate holder 156a loads the processed wafer W (#3) into the second load lock chamber 132 (P1-LL2).

These steps 1 to 4 are shown with white arrows in FIG. 15. These steps 1 to 4 as one cycle are carried out any number of cycles repeatedly. Note, if the wafer W is taken in and out of the vacuum processing chamber 158 at steps 1 and 2 in a certain cycle and the wafer W is taken in and out of the second load lock chamber 132 at steps 3 and 4 in the same cycle, the wafer W will be taken in and out of the fourth vacuum processing chamber 164 at steps 1 and 2 in the sequent cycle and the wafer W will be taken in and out of the first load lock chamber 130 at steps 3 and 4 in the same cycle.

In this operation, the total of time required at steps 1 and 2 amounts to 18 seconds and the total of time required at steps 3 and 4 amounts to 16 seconds. Accordingly, a time T2 required for the operation of one cycle (steps 1 to 4) of the second transfer unit 156 amounts to 34 seconds.

Operations in Relation with the First Load Lock Chamber 130

Next, the actions related to the first load lock chamber 130 will be described. Note, the following actions can be understood with reference to the operations on and after 260 seconds of the timing chart in FIG. 9.

Step 1: The first substrate holder 124a takes the processed wafer W (#2) out of the first load lock chamber 130 (LL1-P1).

Step 2: The second substrate holder 124b loads the unprocessed wafer W (#7) into the first load lock chamber 130 (P2-LL1).

Step 3: Close the gate valve G1 to exhaust the first load lock chamber 130 and subsequently, open the gate valve G3.

Step 4: The second substrate holder 156b takes the unprocessed wafer W (#7) out of the first load lock chamber 130 (LL1-P2).

Step 5: The first substrate holder 156a loads the processed wafer W (#4) into the first load lock chamber 130 (P1-LL1).

Step 6: Close the gate valve G3 to supply the first load lock chamber 130 with gas (i.e., venting the first load lock chamber 130) and subsequently, open the gate valve G1.

In this operation, the total of time required at steps 1 and 2 amounts to 12 seconds, the total of time required at steps 4 and 5 amounts to 16 seconds, and the times required at steps 3 and 6 amount to 26 seconds respectively. Accordingly, a time T3 required for the operation of one cycle (steps 1 to 6) of the first load lock chamber 130 amounts to 80 seconds.

Operations in Relation with the Second Load Lock Chamber 132

Next, the operations related to the second load lock chamber 132 will be described. Note, the following actions can be understood with reference to the operations on and after 220 seconds of the timing chart in FIG. 9.

Step 1: The first substrate holder 124a takes the processed wafer W (#2) out of the second load lock chamber 132.

Step 2: The second substrate holder 124b loads the unprocessed wafer W (#6) into the second load lock chamber 132.

Step 3: Close the gate valve G2 to exhaust the second load lock chamber 132 and subsequently, open the gate valve G4.

Step 4: The second substrate holder 156b takes the unprocessed wafer W (#6) out of the second load lock chamber 132.

Step 5: The first substrate holder 156a loads the processed wafer W (#3) into the second load lock chamber 132.

Step 6: Close the gate valve G4 to supply the second load lock chamber 132 with gas (i.e., venting the first load lock chamber 132) and subsequently, open the gate valve G2.

Hereat, the actions related to the second load lock chamber 132 are substantially identical to those related to the first load lock chamber 130. Accordingly, a time T3 required for the operation of one cycle (steps 1 to 6) of the second load lock chamber 132 amounts to 80 seconds.

Operations in Relation with the First Vacuum Processing Chamber 158

Next, the operations related to the first vacuum processing chamber 158 will be described. Note, the following actions can be understood with reference to the operations on and after 240 seconds of the timing chart in FIG. 9.

Step 1: The first substrate holder 156a takes the processed wafer W (#3) out of the first vacuum processing chamber 158 (PM1-P1).

Step 2: The second substrate holder 156b loads the unprocessed wafer W (#5) into the first vacuum processing chamber 158 (P2-PM1).

Step 3: Close the gate valve G5 and carry out a designated process for the unprocessed wafer W (#5) in the first vacuum processing chamber 158. After completing the process, open the gate valve G5.

In this operation, the total of time required at steps 1 and 2 amounts to 18 seconds and the time required at step 3 amounts to 62 seconds. Accordingly, a time T4 required for the operation of one cycle (steps 1 to 3) of the first vacuum processing chamber 158 amounts to 80 seconds.

Operations in Relation with the Fourth Vacuum Processing Chamber 164

Next, the operations related to the fourth vacuum processing chamber 164 will be described. Note, the following actions can be understood with reference to the operations on and after 270 seconds of the timing chart in FIG. 9.

Step 1: The first substrate holder 156a takes the processed wafer W (#4) out of the fourth vacuum processing chamber 158 (PM2-P1).

Step 2: The second substrate holder 156b loads the unprocessed wafer W (#6) into the fourth vacuum processing chamber 164 (P2-PM2).

Step 3: Close the gate valve G8 and carry out a designated process for the unprocessed wafer W (#6) in the fourth vacuum processing chamber 164. After completing the process, open the gate valve G8.

Hereat, the operations elated to the fourth vacuum processing chamber 164 are substantially identical to those related to the first vacuum processing chamber 158. Accordingly, a time T4 required for the operation of one cycle (steps 1 to 3) of the fourth vacuum processing chamber 164 amounts to 80 seconds.

As mentioned above;

the cycle time T1 of the first transfer unit 124 is 35 seconds;

the cycle time T2 of the second transfer unit 156 is 34 seconds;

the cycle times T3 of the load lock chambers 130 and 132 are 80 seconds respectively; and the cycle times T4 of the vacuum processing chambers 158 and 162 are 80 seconds respectively. Thus, there can be found the following relationship:

$T1 \approx T2 \approx T3$/number of load lock chambers$\approx T4$/number of vacuum processing chambers The establishment of this relationship means enabling loss of time that the constituents 124, 156, 130, 132, 158 and 162 cease the operations to be minimized, also implying the possibility of improving the throughput of the whole apparatus.

The reason of improving the throughput will be described below.

In the conventional apparatus, the cycle time of the load lock chambers is remarkably longer than the cycle time of the vacuum processing chambers (T4/number of vacuum processing chambers) and therefore, the process of the load lock chambers constitutes a "rate controlling" step of the whole apparatus. The reason is because the load lock chamber capable of accommodating two wafers requires a lot of time to supply and exhaust the chamber with gas. Therefore, in place of the conventional provision of two load lock chambers each capable of accommodating two wafers W, the apparatus of the invention provides two load lock chambers each capable of accommodating the single wafer W only, in other words, the chambers of small capacity thereby to reduce a time required to supply and exhaust the respective load lock chambers with gas, by the order of half.

However, it might be noted that if each load lock chamber only accommodates the single wafer W therein, it becomes impossible to deliver the wafer between the load lock chamber and the vacuum processing chamber and also between the cassette and the load lock chamber so quickly. Nevertheless, this problem can be solved by the present invention since the apparatus is provided with the first and second transfer units each having two wafer holders.

In order to improve the throughput of the apparatus, it is necessary to make the cycle time T1 of the first transfer unit 124 and the cycle time T2 of the second transfer unit 156 even. For this purpose, the apparatus of the invention has the positioning unit 302 not arranged in the second transfer chamber 133 but the first transfer chamber 122. Because of the (atmospheric) atmosphere or the near (atmospheric) atmosphere in the first transfer chamber 122, the first transfer unit 124 has a simple structure that it is not required to cope with the vacuum atmosphere, allowing of high-speed action. On the contrary, due to the vacuum atmosphere or the near vacuum atmosphere in the second transfer chamber 133, the second transfer unit 156 has to be constructed to meet the vacuum atmosphere in complication, causing the difficulty in high-speed operation. Additionally, owing to the handling of the wafers at a normal temperature or the near temperature, the substrate holders 124a and 124b of the first transfer unit 124 can be provided with rubber materials, so that it is possible to prevent the wafers from falling in spite of the high-speed operation. While, since the second transfer unit 156, which is required to hold the wafers W of high temperature immediately after processing, is provided with no rubber materials resisting such a high temperature, it is difficult to operate the unit at a high speed. In the transfer unit in charge of the positioning unit 302, the cycle time of operation is increased due to the addition of two steps in one cycle. For this reason, the present apparatus has the positioning unit 302 arranged on the side of the first transfer chamber 122 equipped with the first transfer unit 124 capable of high-speed operation thereby to make the cycle time T1 of the first transfer unit 124 and the cycle time T2 of the second transfer unit 156 even. In case of the positioning unit 302 on the side of the second transfer chamber 133, the cycle time T1 is shortened by 13+α seconds: the former comes from to the elimination of steps 2 and 3 from the action related to the first transfer unit 124; and the latter comes from the deletion of time for the first transfer unit 124 to move to the positioning unit 302. On the other hand, since the operation related to the second transfer unit 156 is accompanied with the actions corresponding to steps 2 and 3 of the first transfer unit 124 and furthermore a time (β seconds) for the unit 156 to move to the positioning unit 302, the cycle time T2 is increased by 13×k+β seconds (k: a ratio in operation speed of the first transfer unit 124 to the second transfer unit 156), so that the cycle time T2 is remarkably larger than the cycle time T1. Note, according to our trial calculation of throughput under the same conditions but the above arrangement, it is found that the arrangement of the positioning unit 302 on the side of the second transfer chamber 133 has a throughput of 72 pcs./hour, while the arrangement of the positioning unit 302 on the side of the first transfer chamber 122 has a throughput of 90 pcs./hour.

Further, according to the present apparatus, since the first transfer unit 124 has two substrate holders 124a and 124b, a positioning time (5 seconds) by the positioning unit 302 does not have any influence on the cycle time T1 of the first transfer unit 124. Conversely, if the first transfer unit 124 has the single substrate holder only, the unit 124 has to stand ready for the completion of positioning of the wafer after the wafer has been delivered to the positioning unit 302 by the first transfer unit 124. While, if the first transfer unit 124 has two substrate holders, there is no need for the unit 124 to stand by the completion of positioning (see steps 2 and 3 of the actions related to the first transfer unit 124).

As mentioned above, according to the present apparatus, the relationship among the cycle times T1 to T4 of the constituents 124, 156, 130, 132, 158 and 162 is optimized to allow of the improvement of throughput.

In the above way, we have described the process in the respective vacuum processing chambers by 62 seconds in each processing time. When the processing time at the vacuum processing chamber takes 102 seconds, it is possible to realize the similar throughput by using three vacuum processing chambers.

We now describe the following comparative examples in order to facilitate understanding of the effects of the present apparatus.

1ST. COMPARATIVE EXAMPLE

First, the first comparative example will be described with reference to FIG. 16. The comparative example of FIG. 16 differs from the embodiment of FIG. 15 in that each of load lock chambers 130' and 132' is capable of accommodating two wafers, and each of first and second transfer units 124', 156' has a single substrate holder 124a, 156a. As to the other structures, the comparative example of FIG. 16 is identical to the embodiment of FIG. 15.

Operations in Relation with the First Transfer Unit 124'

First, the operations related to the first transfer unit 124' will be described.

Step 1: The first transfer unit 124' takes the unprocessed wafer W out of the cassette 106.

Step 2: The first transfer unit 124' moves to the front of the positioning unit 302 and loads the unprocessed wafer W into the positioning unit 302.

Step 3: The positioning unit 302 carries out positioning of the unprocessed wafer W (the time required is 5 seconds).

Step 4: The first transfer unit 124' takes the unprocessed wafer W out of the positioning unit 302.

Step 5: The first transfer unit 124' moves to the front of the first load lock chamber 130' and loads the unprocessed wafer W into the first load lock chamber 130'.

Step 6: The first transfer unit 124' takes the processed wafer W out of the first load lock chamber 130'.

Step 7: The first transfer unit 124' moves to the front of the cassette 106 and loads the processed wafer W into the cassette 106).

These steps 1 to 7 are shown with black arrows in FIG. 16. The cycle of steps 1 to 7 is carried out repeatedly while alternating the load lock chambers (130' and 132') where the wafers are to be delivered.

The cycle time T1' of the first transfer unit 124' amounts to 40 seconds since a time (5 seconds) at step 3 is added to the cycle time T1 of the first transfer unit 124.

Operations in Relation with the Second Transfer Unit 156'

Next, the operations related to the second transfer unit 156' will be described.

Step 1: The second transfer unit 156' takes the processed wafer W out of the first vacuum processing chamber 158.

Step 2: The second transfer unit 156' loads the processed wafer W into the second load lock chamber 132'.

Step 3: The second transfer unit 156' takes the unprocessed wafer W out of the second load lock chamber 132'.

Step 4: The second transfer unit 156' loads the unprocessed wafer W into the first vacuum processing chamber 158.

These steps 1 to 4 are shown with white arrows in FIG. 16. The cycle of steps 1 to 4 is carried out repeatedly while alternating the load lock chamber (130' or 132') and the vacuum processing chambers (158, 164) where the wafers are to be delivered.

The time of steps 1 to 4 related to the second transfer unit 156' (the cycle time T2' of the second transfer unit 156') amounts to 34 sec. as similar to the case of the second transfer unit 156. Note, although the amount of rotation of the second transfer unit 156' is twice as large as that of the second transfer unit 156, an increment in rotation time is neglected in the above measurement.

Operations in Relation with the First Load Lock Chamber 130'

Next, the operations related to the first load lock chamber 130' will be described.

Step 1: The first transfer unit 124' loads the unprocessed wafer W into the first load lock chamber 130'.

Step 2: The first transfer unit 124' takes the processed wafer W out of the first load lock chamber 130'.

Step 3: Close the gate valve G1 to exhaust the first load lock chamber 130' and subsequently, open the gate valve G3.

Step 4: The second transfer unit 156' loads the processed wafer W into the first load lock chamber 130'.

Step 5: The second transfer unit 156' takes the unprocessed wafer W out of the first load lock chamber 130'.

Step 6: Close the gate valve G3 to supply the first load lock chamber 130' with gas and subsequently, open the gate valve G1.

In this operation, the total of time of steps 1, 2, 4 and 5 related to the first load lock chamber 130' is generally equal to that of steps 1, 2, 4 and 5 related to the first load lock chamber 130. However, the times of steps 3 and 6 related to the first load lock chamber 130' increase to 52 sec. respectively, corresponding to the increase in volume of the load lock chamber.

Accordingly, the time required at steps 1 to 6 related to the first load lock chamber 130' (the cycle time T3' of the first load lock chamber 130') amounts to 132 sec. Note, the cycle time of the second load lock chamber 132' amounts to 132 sec., too.

Operations in Relation with the First Vacuum Processing Chamber 158

Next, the operations related to the first vacuum processing chamber 158 will be described.

Step 1: The second transfer unit 156' loads the unprocessed wafer W into the first vacuum processing chamber 158.

Step 2: Close the gate valve G5 and carry out a designated process for the unprocessed wafer W in the first vacuum processing chamber 158. After completing the process, open the gate valve G5.

Step 3: The second transfer unit 156' takes the processed wafer W out of the first vacuum processing chamber 158.

In this operation, the time required at steps 1, 2 and 3 related to the first vacuum processing chamber 158 (the cycle time T4' of the first vacuum processing chamber 158) amounts to 80 sec., as similar to the embodiment of FIG. 15. Note, the cycle time of the fourth vacuum chamber 164 also amounts to 80 sec.

In the first comparative example,
the cycle time T1' of the first transfer unit 124' is 40 sec.;
the cycle time T2' of the second transfer unit 156' is 34 sec.;
the cycle times T3' of the first and second load lock chambers 130' and 132' are 132 sec. respectively; and
the cycle times T4' of the first and fourth vacuum processing chambers 158 and 164 are 80 seconds, respectively. Thus, in this example, there is greatly collapsed the above-mentioned relationship of:

$$T1 \approx T2 \approx T3/\text{number of load lock chambers} \approx T4/\text{number of load vacuum processing chambers}$$

Since the throughput of the whole apparatus is occupied by the longest cycle time (the cycle time of the load lock chamber in this case), it will be understood that the apparatus of the 1st. comparative example has a remarkably-small throughput in comparison with that of the apparatus of the invention.

2ND. COMPARATIVE EXAMPLE

Next, the second comparative example will be described with reference to FIG. 17. The comparative example of FIG. 17 differs from the embodiment of FIG. 15 in that each of the first and second transfer unit 124', 156' has the single substrate holder 124a, 156a, and a buffer B (temporary space for wafer) is arranged in the second transfer chamber 133. As to the other structures, the comparative example of FIG. 17 is identical to the embodiment of FIG. 15.

Operations in Relation with the First Transfer Unit 124'

First, the operations related to the first transfer unit 124' will be described.

Step 1: The first transfer unit 124' moves to the front of the first load lock chamber 130 and takes the processed wafer W out of the first load lock chamber 130.

Step 2: The first transfer unit 124' moves to the front of the cassette 106 and loads the processed wafer W into the cassette 106.

Step 3: The first transfer unit 124' moves to the front of the positioning unit 302 and takes the aligned wafer W out of the positioning unit 302.

Step 4: The first transfer unit 124' moves to the front of the first load lock chamber 130 and loads the unprocessed wafer W into the first load lock chamber 130.

Step 5: The first transfer unit 124' moves to the front of the cassette 106 and takes the unprocessed wafer W out of the cassette 106.

Step 6: The first transfer unit 124' moves to the front of the positioning unit 302 and loads the unprocessed wafer W into the positioning unit 302.

These steps 1 to 6 are shown with black arrows in FIG. 17. The cycle of steps 1 to 6 is carried out repeatedly while alternating the load lock chambers (130 and 132) where the wafers are to be delivered.

Comparing with the cycle time T1 of the embodiment, the cycle time T1" of the first transfer unit 124' is increased by 10 sec. to 45 sec. because of the elongated moving distance of the first transfer unit 124' per cycle.

Operations in Relation with the Second Transfer Unit 156'

Next, the operations related to the second transfer unit 156' will be described.

Step 1: The second transfer unit 156' takes the processed wafer W out of the first vacuum processing chamber 158.

Step 2: The second transfer unit 156' loads the processed wafer W into the buffer B.

Step 3: The second transfer unit 156' takes the unprocessed wafer W out of the second load lock chamber 132.

Step 4: The second transfer unit 156' loads the unprocessed wafer W into the first vacuum processing chamber 158.

Step 5: The second transfer unit 156' takes the processed wafer W out of the buffer B.

Step 6: The second transfer unit 156' loads the processed wafer W into the second load lock chamber 132.

These steps 1 to 6 are shown with white arrows in FIG. 17. The cycle of steps 1 to 6 is carried out repeatedly while alternating the load lock chamber (130 or 132) and the vacuum processing chamber (158 or 164) where the wafers are to be delivered.

Comparing with the cycle time T2 of the embodiment, the cycle time T2" of the second transfer unit 156' is increased to 50 sec. by the addition of delivering time (16 sec.) of the wafer W to and from the buffer B (steps 2 and 5).

Operations in Relation with the First Load Lock Chamber 130

Next, the operations related to the first load lock chamber 130 will be described.

Step 1: The first transfer unit 124' takes the processed wafer W out of the first load lock chamber 130.

Step 2: The first transfer unit 124' loads the unprocessed wafer W into the first load lock chamber 130.

Step 3: Close the gate valve G1 to exhaust the first load lock chamber 130 and subsequently, open the gate valve G3.

Step 4: The second transfer unit 156' takes the unprocessed wafer W out of the first load lock chamber 130.

Step 5: The second transfer unit 156' loads the processed wafer W into the first load lock chamber 130.

Step 6: Close the gate valve G3 to supply the first load lock chamber 130 with gas and subsequently, open the gate valve G1.

There is no change between the number of action steps related to the first load lock chamber 130 of this comparative example and the number of action steps related to the first load lock chamber 130 of the embodiment. Nevertheless, as understood with reference to the descriptions of the actions related to the first and second transfer units 124' and 156' of this comparative example, another wafer W is not accommodated in the first load lock chamber 130 immediately after the wafer W has been unloaded out of the load lock chamber 130. Therefore, comparing with the cycle time T3 of the first load lock chamber 130 of the embodiment, the cycle time T3" of this comparative example is increased by 30 sec. to 110 sec. Note, the cycle time of the second load lock chamber 132 amounts to 110 sec. similarly.

Operations in Relation with the First Vacuum Processing Chamber 158

Next, the operations related to the first vacuum processing chamber 158 will be described.

Step 1: The second transfer unit 156' loads the unprocessed wafer W into the first vacuum processing chamber 158.

Step 2: Close the gate valve G5 and carry out a designated process for the unprocessed wafer W in the first vacuum processing chamber 158. After completing the process, open the gate valve G5.

Step 3: The second transfer unit 156' takes the processed wafer W out of the first vacuum processing chamber 158.

There is no change between the number of action steps related to the first vacuum processing chamber 158 of this comparative example and the number of action steps related to the same chamber 158 of the embodiment. Nevertheless, as understood with reference to the descriptions of the actions related to the second transfer unit 156' of this comparative example, another wafer W is not accommodated in the first vacuum processing chamber 158 immediately after the wafer W has been unloaded out of the same chamber 158. Therefore, comparing with the cycle time T4 of the first processing chamber 158 of the embodiment, the cycle time T4" of this comparative example is increased by 16 sec. to 96 sec. Note, the cycle time of the second vacuum processing chamber 164 amounts to 96 sec. similarly.

In the second comparative example,
the cycle time T1" of the first transfer unit 124' is 45 sec.;
the cycle time T2" of the second transfer unit 156' is 50 sec.;
the cycle times T3" of the first and second load lock chambers 130 and 132 are 110 sec. respectively; and
the cycle times T4" of the first and second vacuum processing chambers 158 and 164 are 96 seconds respectively.

That is, not only does the above-mentioned relationship (T1≈T2≈T3/number of load lock chambers≈T4/number of vacuum processing chambers) collapse, but also the cycle times of the individual units are increased. Therefore, it will be understood that the apparatus of the 2nd. comparative example has also a remarkably-small throughput in comparison with that of the apparatus of the invention.

As can be understood from the above descriptions, according to the apparatus of the present invention, it is possible to improve the throughput of the whole apparatus remarkably.

Note, in the above-mentioned embodiment of the invention, the processing apparatus employs the transfer units each having two arm parts provided with, at respective ends thereof, with the substrate holders, as shown in FIGS. 3 and 7. In the modification, the present invention is applicable to the apparatus having the transfer units each having the single arm part provided, at the leading end, with two substrate holders, accomplishing the advantageous effects.

What is claimed is:

1. A method of transferring a plurality of objects in a processing apparatus, said method comprising:
    providing a processing apparatus comprising:
        a first enclosure defining a first transfer space having an atmosphere of atmospheric pressure;
        a load port site, in which a plurality of load ports are aligned adjacently to the first transfer space, each of the load ports being capable of mounting a cassette for accommodating objects to be processed;
        a second enclosure defining a second transfer space having an atmosphere of vacuum or negative pressure;
        a plurality of vacuum processing chambers arranged around the second transfer space, the vacuum processing chambers numbering NP, where NP is a natural number;
        a plurality of load lock chambers arranged between the first transfer space and the second transfer space, the load lock chambers numbering NL, where NL is a natural number, each of the load lock chambers being adapted to accommodate only one object therein;
        a positioning unit arranged adjacent to the first transfer space and adapted to adjust the positions of an object;
        a first transfer unit arranged in the first transfer space to transfer the objects among the cassette, the load lock chambers and the positioning unit, the first transfer unit having first and second holders each adapted to hold only one object; and
        a second transfer unit arranged in the second transfer space to transfer the objects between the load lock chambers and the vacuum processing chambers, the second transfer unit having first and second holders each adapted to hold only one object, operating the first transfer unit including the steps of:

step S1 of removing an unprocessed object from a cassette mounted on one of the load ports by the first holder of the first transfer unit;

step S2 of removing an unprocessed object, having been positioned by the positioning unit, from the positioning unit by the second holder of the first transfer unit;

step S3 of delivering the unprocessed object, having been removed from the cassette, to the positioning unit by the first holder of the first transfer unit;

step S4 of removing a processed object, having been processed by one of the vacuum processing chambers, from one of the load lock chambers by the first holder of the first transfer unit;

step S5 of delivering the unprocessed object, having been removed from the positioning unit, to one of the load lock chambers, by the second holder of the first transfer unit; and step S6 of delivering the unprocessed object, having been removed from the load lock chamber, to a cassette mounted on one of the load ports by the first holder of the first transfer unit, and wherein the steps S1 to S6 are performed sequentially and cyclically, and performing an operation relating to one of the load lock chambers, the operation including the steps of:

step S1' of delivering an unprocessed object to the load lock chamber by the second holder of the first transfer unit;

step S2' of evacuating the load lock chamber so that an atmosphere of vacuum or negative pressure is established in the load lock chamber;

step S3' of removing the unprocessed object from the load lock chamber by the second holder of the second transfer unit;

step S4' of delivering a processed object to the load lock chamber by the first holder of the second transfer unit;

step S5' of venting the load lock chamber so that an atmosphere of atmospheric pressure is established in the load lock chamber; and step S6' of removing the processed object from the load lock chamber by the first holder of the first transfer unit, wherein the steps S1' to S6 are performed sequentially and cyclically, and wherein T1 is substantially equal to T3/NL, where T1 is a cycle time of the first transfer unit which is a time required for performing steps S1 to S6 of the first transfer unit, and T3 is a cycle time of the load lock chamber which is a time required for performing steps S1' to S6' for the load lock chamber.

2. The method according to claim 1, further comprising a step of operating the second transfer unit, including the steps of:

step S1" of removing a processed object from one of the vacuum processing chambers by the first holder of the second transfer unit;

step S2" of delivering an unprocessed object to said one of the vacuum processing chambers by the second holder of the second transfer unit;

step S3" of removing an unprocessed object from one of the load lock chambers by the second holder of the second transfer unit; and step S4" of delivering the processed object, having been removed from said one of the vacuum processing chambers, to said one of the load lock chambers by the first holder of the second transfer unit, wherein said cycle time T1 is substantially equal to T2, where T2 is a cycle time of the second transfer unit which is a time required for performing steps S1" to S4" of the second transfer unit.

3. The method according to claim 1, further comprising a step of performing an operation relating to one of the vacuum processing chambers, the operation including the steps of:

step S1''' of removing a processed object from one of the vacuum processing chambers;

step S2''' of delivering an unprocessed object to said one of the vacuum chambers; and step S3''' of treating the unprocessed object in said one of the vacuum chambers by a predetermined process, wherein the steps S1''' to S3''' are performed sequentially and cyclically, and wherein said cycle time T1 is substantially equal to T4/NP, where T4 is a cycle time of the vacuum processing chamber which is a time required for performing steps S1''' to S3''' for the vacuum processing chamber.

4. The method according to claim 1, wherein the unprocessed object is heated in said one of the load lock chamber when the step S2' is performed.

5. The method according to claim 1, wherein the processed object is cooled in said one of the load lock chamber when the step S5' is performed.

6. A method of transferring a plurality of objects in a processing apparatus, said method comprising:

providing a processing apparatus comprising:

a first enclosure defining a first transfer space having an atmosphere of atmospheric pressure;

a load port site, in which a plurality of load ports are aligned adjacently to the first transfer space, each of the load ports being capable of mounting a cassette for accommodating objects to be processed;

a second enclosure defining a second transfer space having an atmosphere of vacuum or negative pressure;

a plurality of vacuum processing chambers arranged around the second transfer space, the vacuum processing chambers numbering NP, where NP is a natural number;

a plurality of load lock chambers arranged between the first transfer space and the second transfer space, the load lock chambers numbering NL, where NL is a natural number, each of the load lock chambers being adapted to accommodate only one object therein;

a positioning unit arranged adjacent to the first transfer space and adapted to adjust the positions of an object;

a first transfer unit arranged in the first transfer space to transfer the objects among the cassette, the load lock chambers and the positioning unit, the first transfer unit having first and second holders each adapted to hold only one object; and a second transfer unit arranged in the second transfer space to transfer the objects between the load lock chambers and the vacuum processing chambers, the second transfer unit having first and second holders each adapted to hold only one object;

operating the first transfer unit including the steps of:
  step S1 of removing an unprocessed object from a cassette mounted on one of the load ports by the first holder of the first transfer unit;
  step S2 of removing an unprocessed object, having been positioned by the positioning unit, from the positioning unit by the second holder of the first transfer unit;
  step S3 of delivering the unprocessed object, having been removed from the cassette, to the positioning unit by the first holder of the first transfer unit;
  step S4 of removing a processed object, having been processed by one of the vacuum processing chambers, from one of the load lock chambers by the first holder of the first transfer unit;
  step S5 of delivering the unprocessed object, having been removed from the positioning unit, to one of the load lock chambers, by the second holder of the first transfer unit; and
  step S6 of delivering the processed object, having been removed from the load lock chamber, to a cassette mounted on one of the load ports by the first holder of the first transfer unit,
  wherein the steps S1 to S6 are performed sequentially and cyclically, and
performing an operation relating to one of the vacuum processing chambers, the operation including the steps of:
  step S1''' of removing a processed object from one of the vacuum processing chambers;
  step S2''' of delivering an unprocessed object to said one of the vacuum chambers; and
  step S3''' of treating the unprocessed object in said one of the vacuum chambers by a predetermined process,
  wherein the steps S1''' to S3''' are performed sequentially and cyclically, and
  wherein T1 is substantially equal to T4/NP, where T1 is a cycle time of the first transfer unit which is a time required for performing steps S1 to S6 of the first transfer unit, and T4 is a cycle time of the vacuum processing chamber which is a time required for performing steps S1''' to S3''' for the vacuum processing chamber.

7. The method according to claim 6, further comprising a step of operating the second transfer unit, including the steps of:
  step S1'' of removing a processed object from one of the vacuum processing chambers by the first holder of the second transfer unit;
  step S2'' of delivering an unprocessed object to said one of the vacuum processing chambers by the second holder of the second transfer unit;
  step S3'' of removing an unprocessed object from one of the load lock chambers by the second holder of the second transfer unit; and
  step S4'' of delivering the processed object, having been removed from said one of the vacuum processing chambers, to said one of the load lock chambers by the first holder of the second transfer unit,
  wherein said cycle time TI is substantially equal to T2, where T2 is a cycle time of the first transfer unit which is a time required for performing steps S1'' to S4'' of the second transfer unit.

8. The method according to claim 6, further comprising a step of performing an operation relating to one of the load lock chambers, the operation including the steps of:
  step S1' of delivering an unprocessed object to the load lock chamber by the second holder of the first transfer unit;
  step S2' of evacuating the load lock chamber so that an atmosphere of vacuum or negative pressure is established in the load lock chamber;
  step S3' of removing the unprocessed object from the load lock chamber by the second holder of the second transfer unit;
  step S4' of delivering a processed object to the load lock chamber by the first holder of the second transfer unit;
  step S5' of venting the load lock chamber so that an atmosphere of atmospheric pressure is established in the load lock chamber; and
  step S6' of removing the processed object from the load lock chamber by the first holder of the first transfer unit,
  wherein the steps S1' to S6' are performed sequentially and cyclically, and
  wherein said cycle time T1 is substantially equal to T3/NL, where T3 is a cycle time of the load lock chamber which is a time required for performing steps S1' to S6' for the load lock chamber.

9. The method according to claim 8, wherein the unprocessed object is heated in said one of the load lock chamber when the step S2' is performed.

10. The method according to claim 8, wherein the processed object is cooled in said one of the load lock chamber when the step S5' is performed.

* * * * *